(12) United States Patent
Noma et al.

(10) Patent No.: US 11,728,424 B2
(45) Date of Patent: Aug. 15, 2023

(54) ISOLATION IN A SEMICONDUCTOR DEVICE

(71) Applicant: SEMICONDUCTOR COMPONENTS INDUSTRIES, LLC, Phoenix, AZ (US)

(72) Inventors: Takashi Noma, Ota (JP); Yusheng Lin, Phoenix, AZ (US); Kazuo Okada, Ota (JP); Hideaki Yoshimi, Oizumi-machi (JP); Shunsuke Yasuda, Ora-gun (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 11 days.

(21) Appl. No.: 16/949,321

(22) Filed: Oct. 26, 2020

(65) Prior Publication Data
US 2022/0131002 A1 Apr. 28, 2022

(51) Int. Cl.
*H01L 29/78* (2006.01)
*H01L 29/66* (2006.01)
*H01L 29/739* (2006.01)

(52) U.S. Cl.
CPC .... *H01L 29/7816* (2013.01); *H01L 29/66295* (2013.01); *H01L 29/7395* (2013.01)

(58) Field of Classification Search
CPC ............... H01L 21/76; H01L 21/76256; H01L 21/76264; H01L 21/76283; H01L 29/66295; H01L 29/7395
See application file for complete search history.

(56) References Cited

U.S. PATENT DOCUMENTS

| | | |
|---|---|---|
| 3,674,800 A | 7/1972 | Sweeney et al. |
| 11,257,759 B1 * | 2/2022 | Carney ................ H01L 23/528 |
| 2005/0011986 A1 | 1/2005 | Foo et al. |
| 2008/0296611 A1 | 12/2008 | Kobayashi et al. |
| 2013/0328166 A1 | 12/2013 | Willkofer et al. |
| 2014/0151844 A1 * | 6/2014 | Steeneken ......... H01L 21/76232 438/424 |
| 2014/0184309 A1 * | 7/2014 | Steeneken ............ H03K 17/102 327/434 |

(Continued)

OTHER PUBLICATIONS

Nakagawa, A., "Power IC Technologies", Ch. 8, 2000, The VLSI Handbook, Ed. Wai-Kai Chen, CRC Press LLC, Section 8.7 (Year: 2000).*

*Primary Examiner* — Matthew C Landau
*Assistant Examiner* — Mark Hatzilambrou
(74) *Attorney, Agent, or Firm* — Brake Hughes Bellermann LLP

(57) ABSTRACT

According to an aspect, a semiconductor device for integrating multiple transistors includes a wafer substrate including a first region and a second region. The first region defines at least a portion of at least one first transistor. The second region defines at least a portion of at least one second transistor. The semiconductor device includes an isolation area located between the first region and the second region, at least one terminal of the at least one first transistor contacting the first region of the wafer substrate, at least one terminal of the at least one second transistor contacting the second region of the wafer substrate, and an encapsulation material, where the encapsulation material includes a portion located within the isolation area.

16 Claims, 22 Drawing Sheets

(56) References Cited

U.S. PATENT DOCUMENTS

| | | |
|---|---|---|
| 2017/0104478 A1* | 4/2017 | Alexander .......... H01L 29/1004 |
| 2018/0096944 A1* | 4/2018 | Mori ....................... H01L 24/97 |
| 2019/0267344 A1 | 8/2019 | Seddon et al. |
| 2020/0203290 A1 | 6/2020 | Summerfelt et al. |
| 2021/0167002 A1 | 6/2021 | Seddon et al. |

* cited by examiner

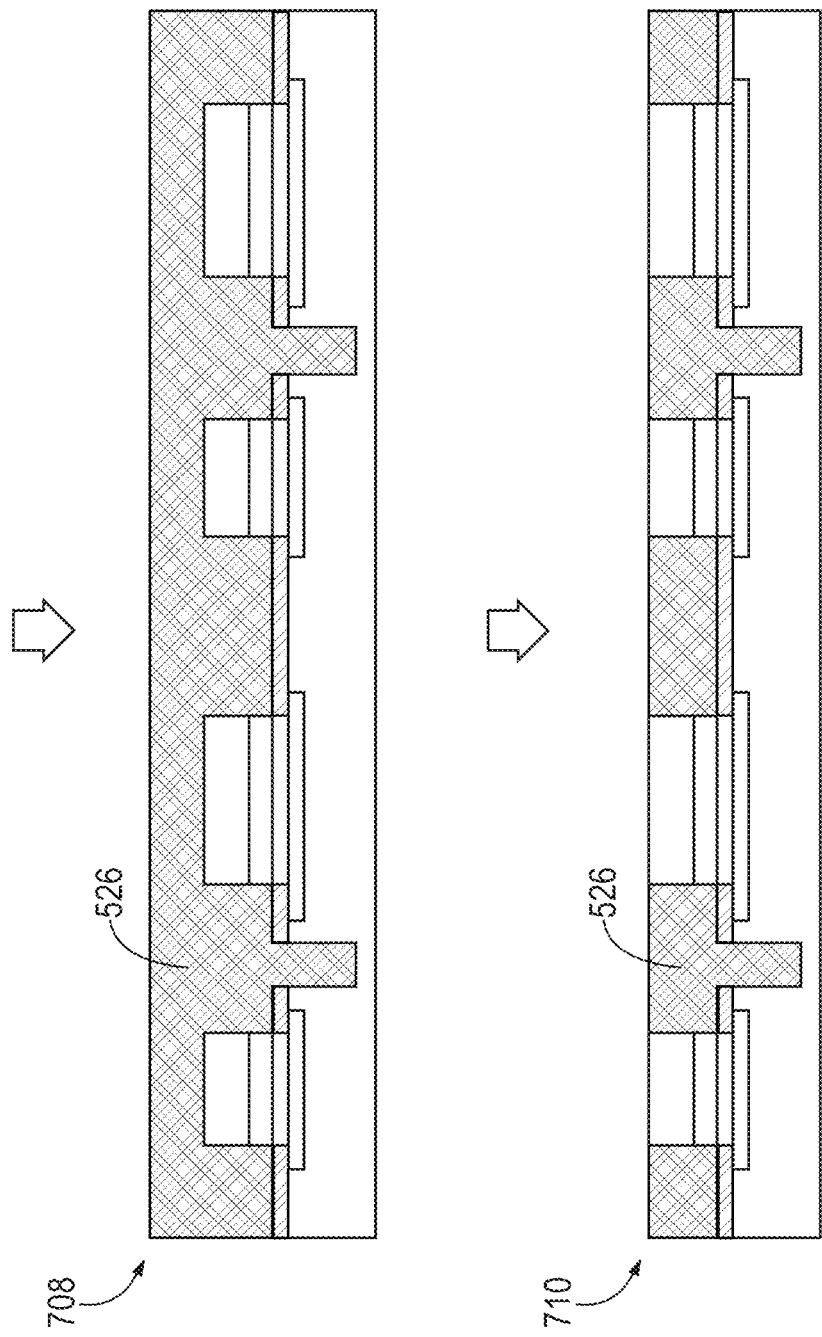

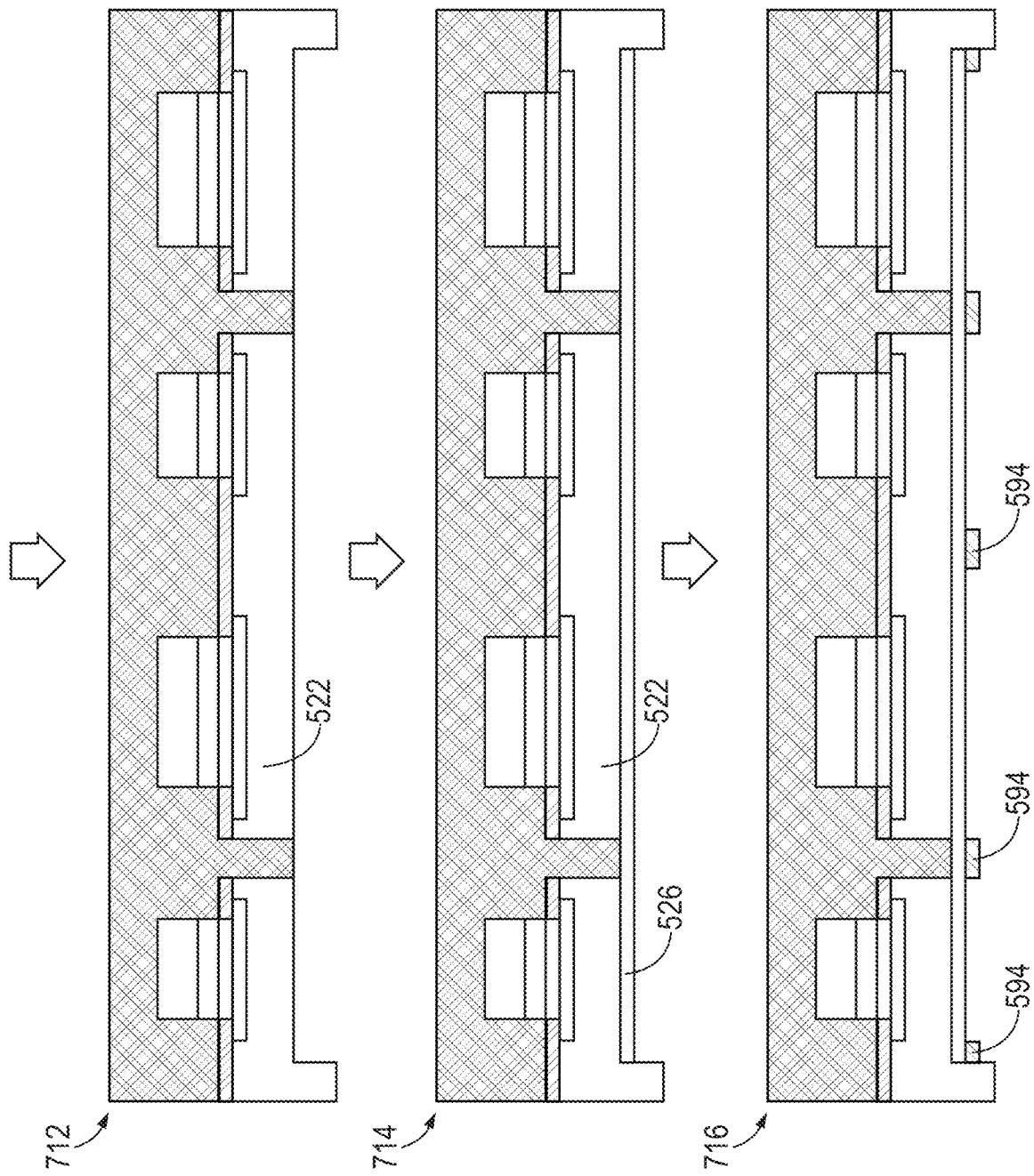

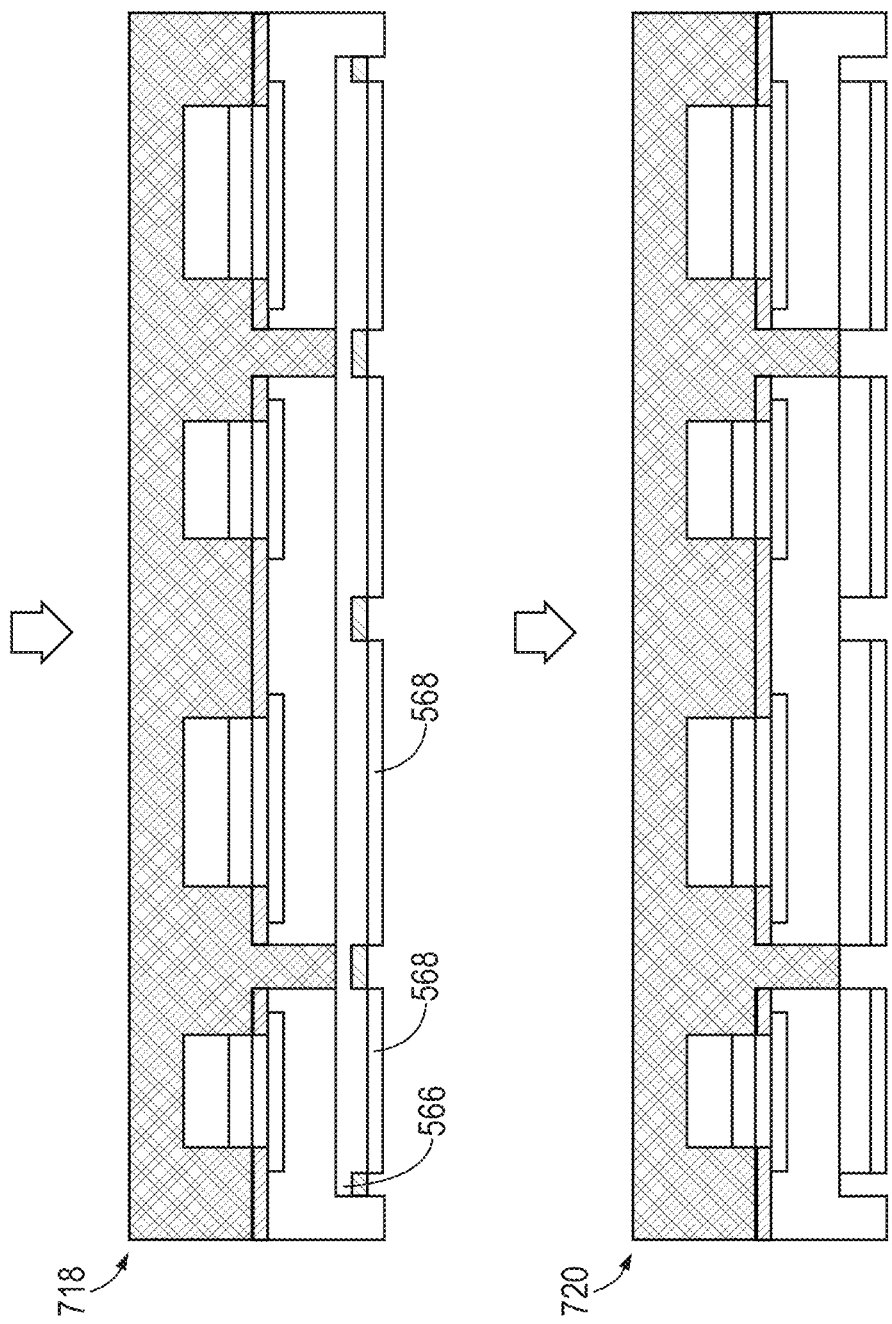

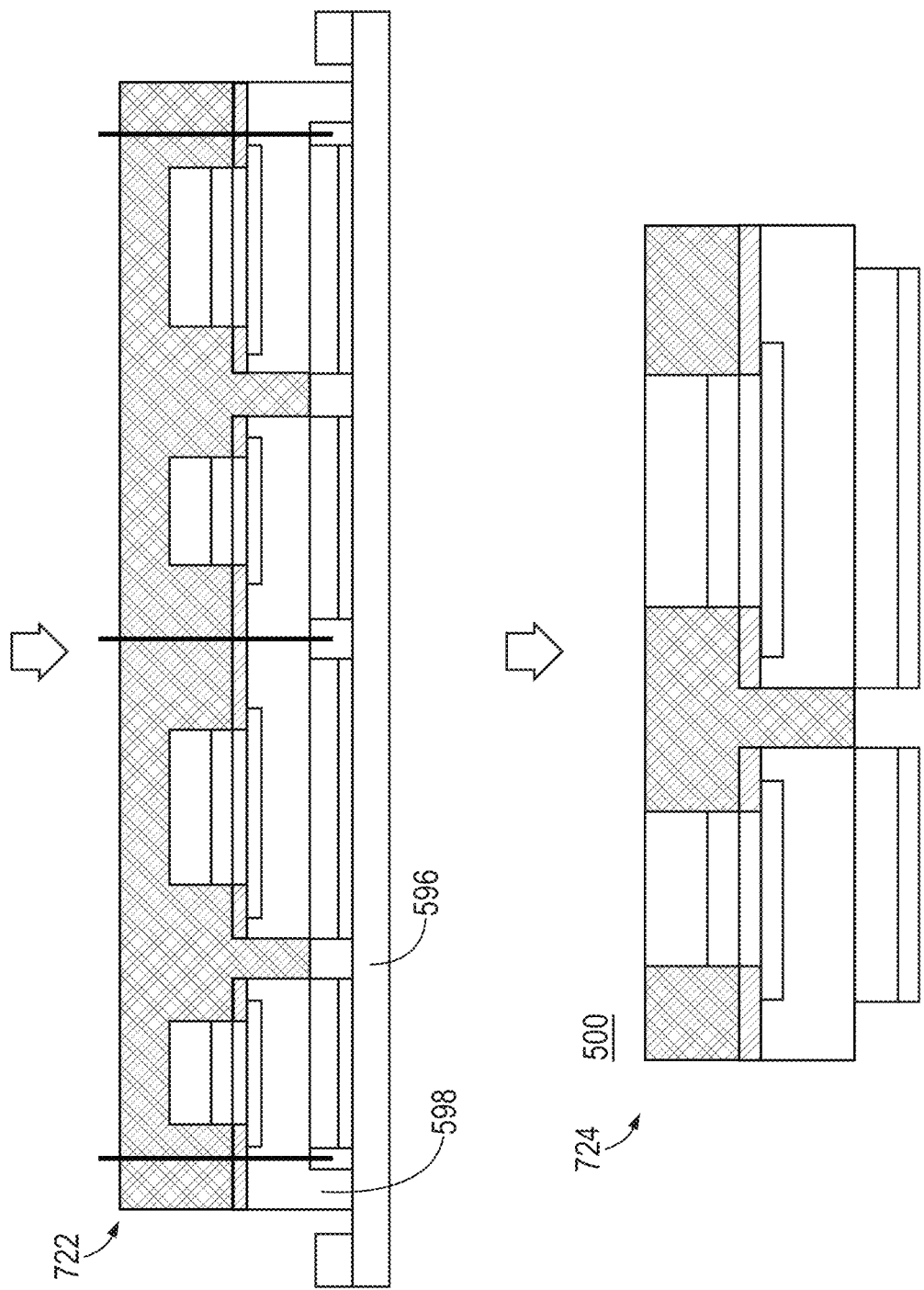

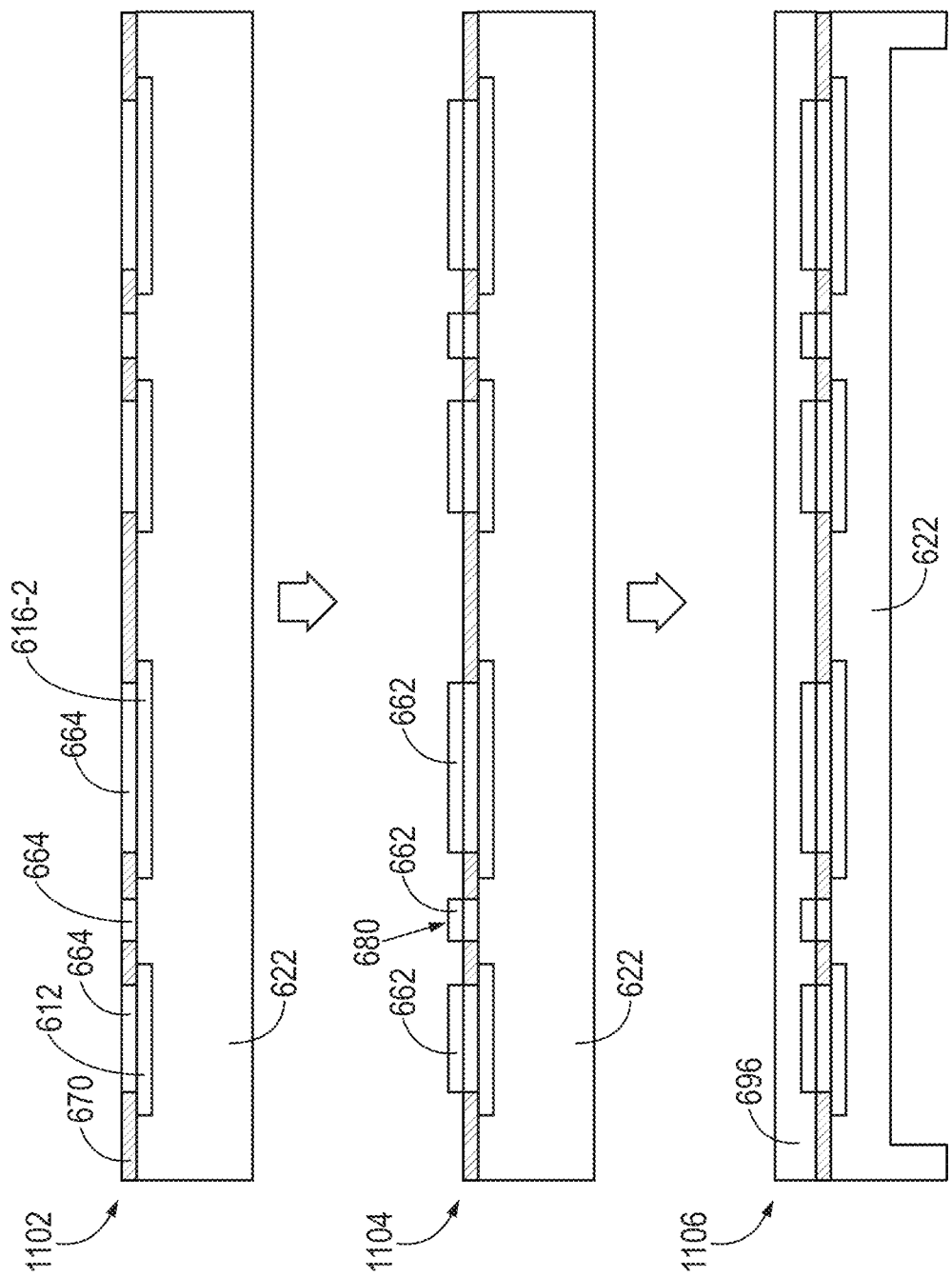

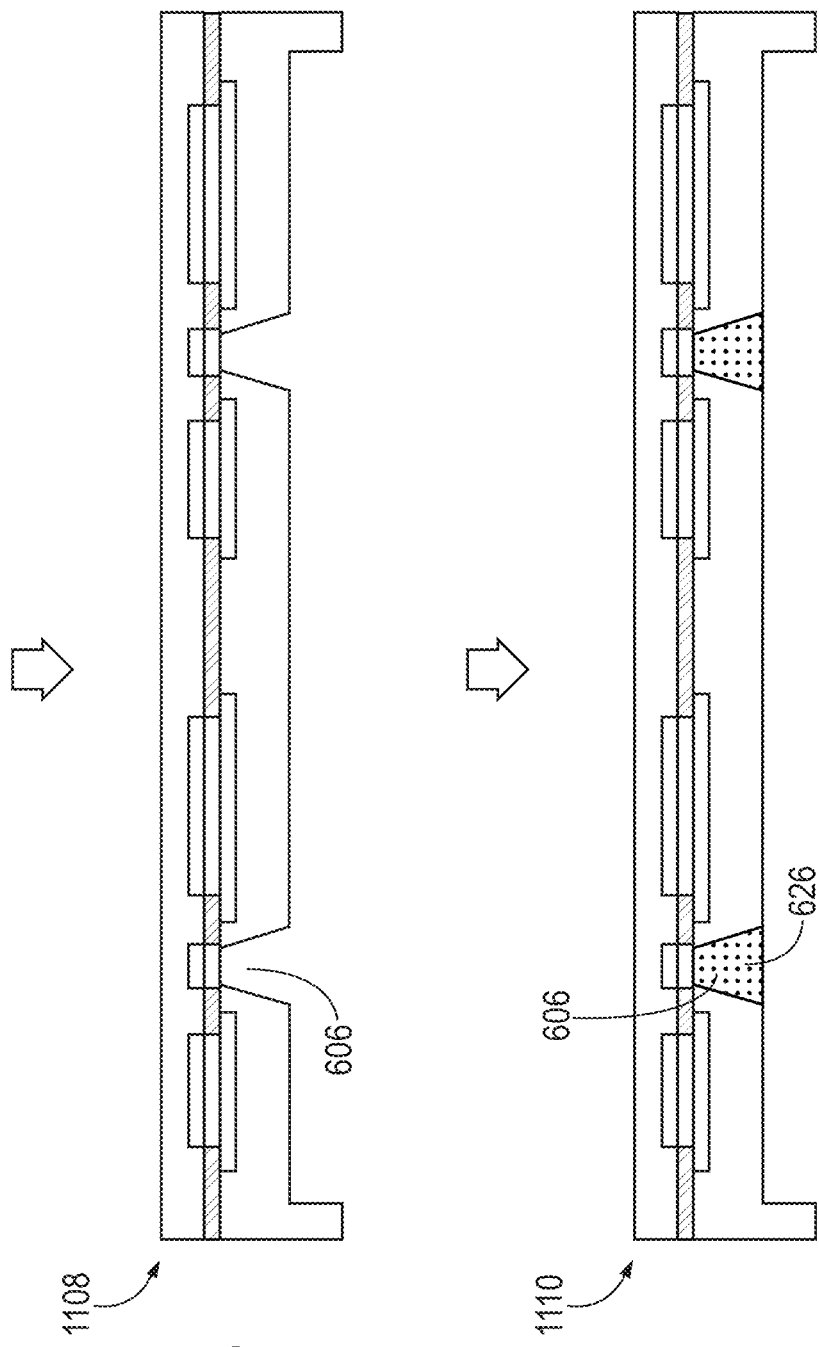

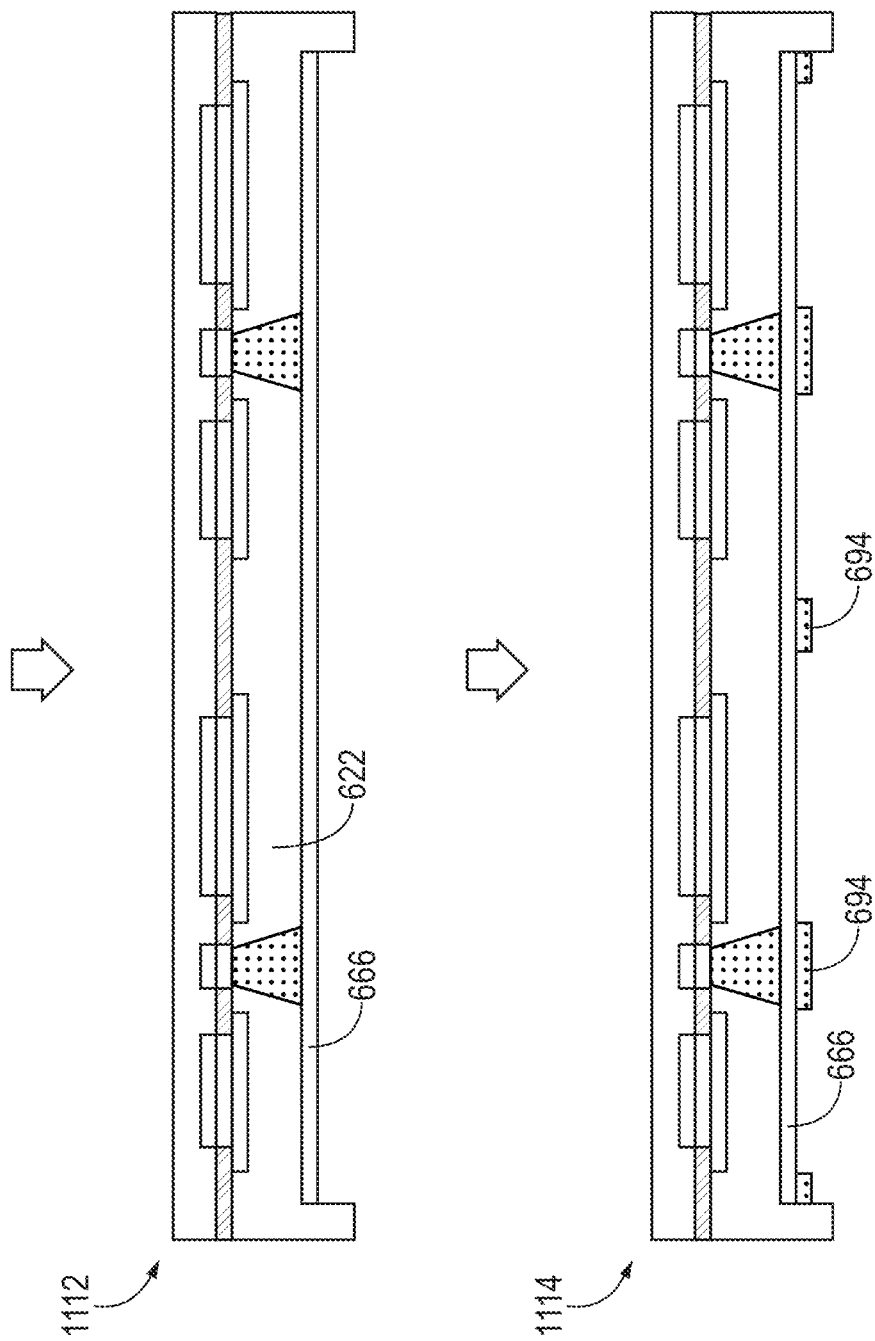

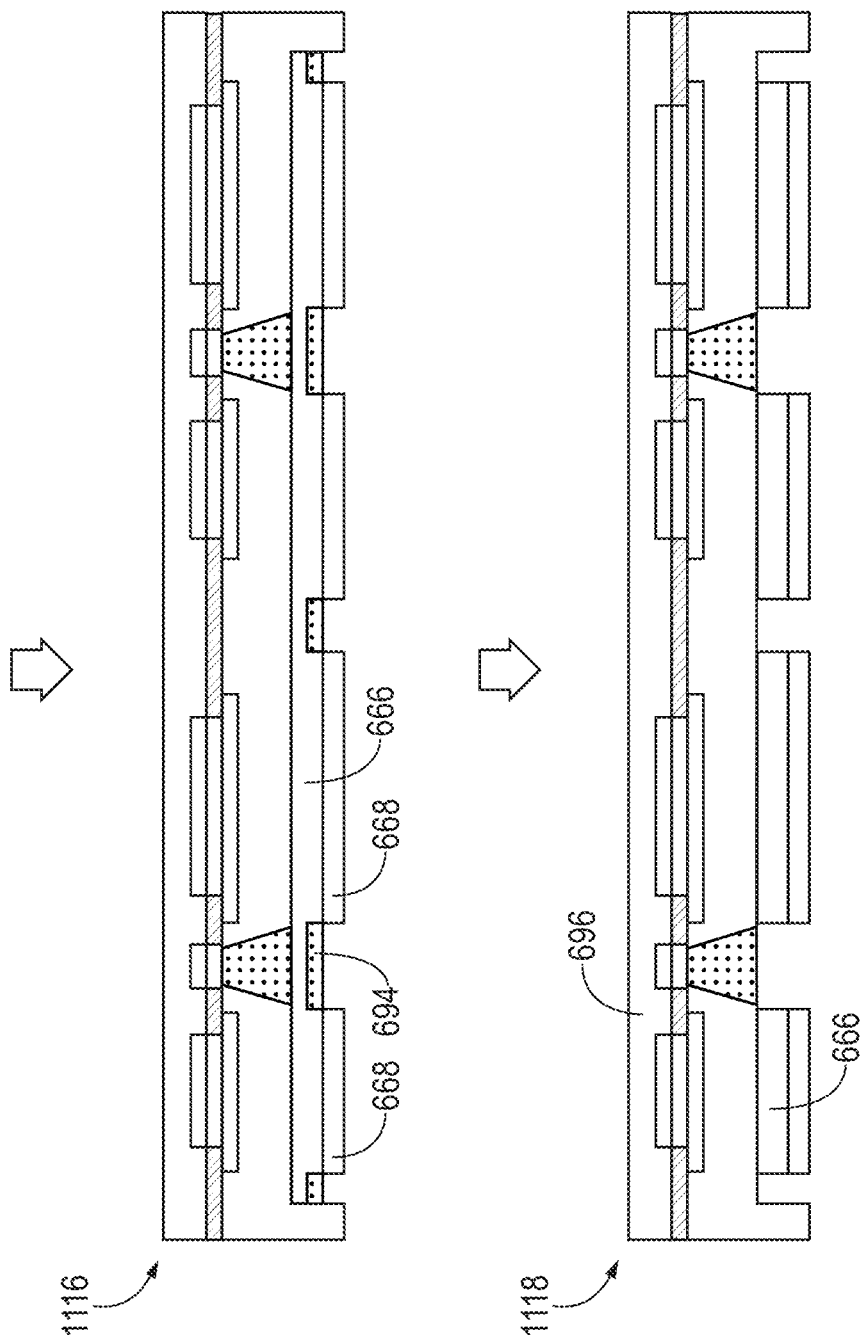

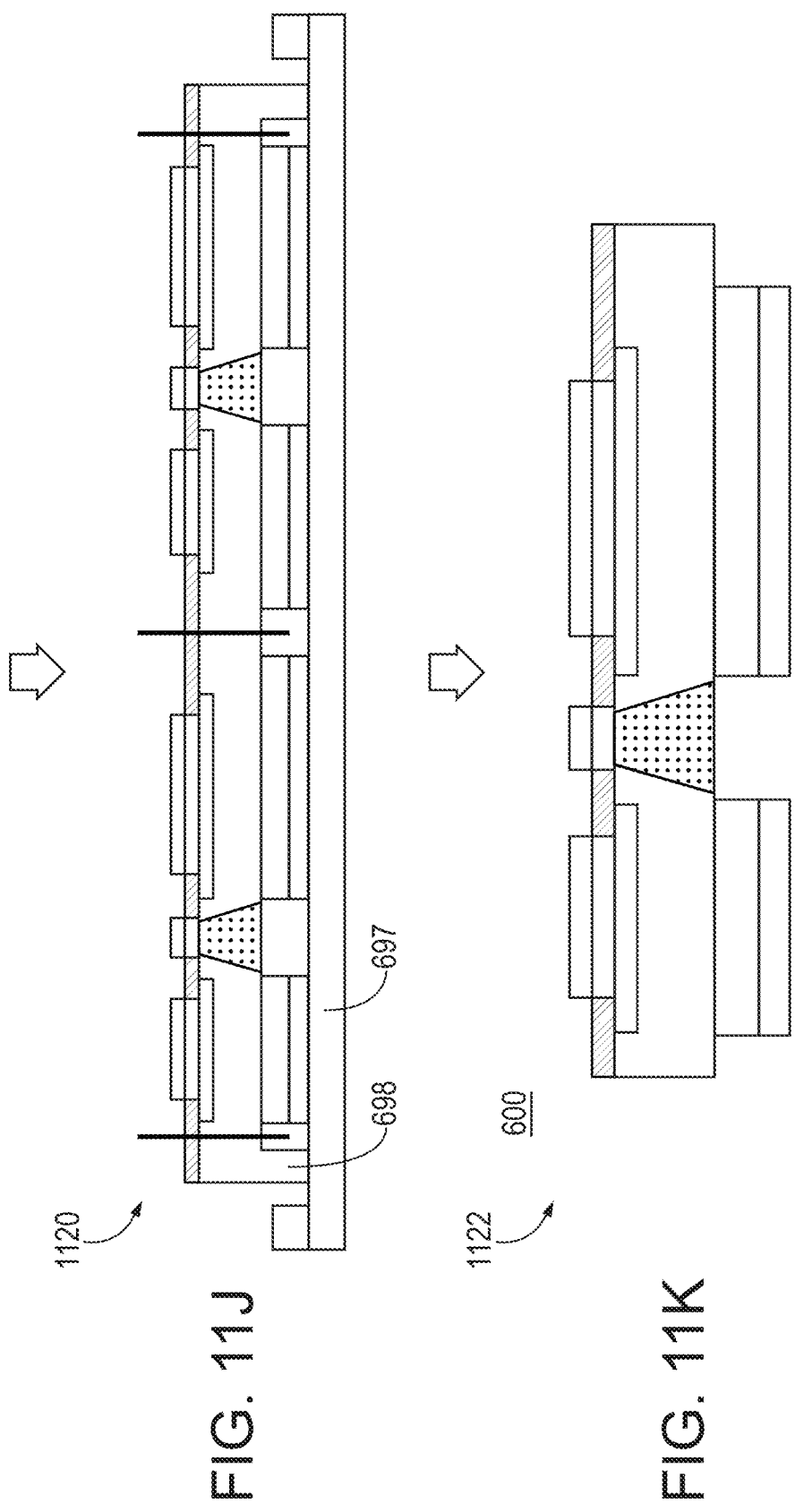

ISOLATION IN A SEMICONDUCTOR DEVICE

TECHNICAL FIELD

This description relates to isolation in a semiconductor device.

BACKGROUND

A semiconductor package may include multiple devices such as multiple transistors (e.g., field-effect transistors (FETs)). However, some conventional semiconductor packages may be relatively large and expensive to manufacture to ensure proper isolation between the devices.

SUMMARY

According to an aspect, a semiconductor device for integrating multiple transistors includes a wafer substrate including a first region and a second region. The first region defines at least a portion of at least one first transistor. The second region defines at least a portion of at least one second transistor. The semiconductor device includes an isolation area located between the first region and the second region, at least one terminal of the at least one first transistor contacting the first region of the wafer substrate, at least one terminal of the at least one second transistor contacting the second region of the wafer substrate, and an encapsulation material, where the encapsulation material includes a portion located within the isolation area.

According to some aspects, the semiconductor device may include one or more of the following features (or any combination thereof). The isolation area is a first isolation area, and the wafer substrate includes a third region, where the third region defines at least a portion of at least one third transistor. The semiconductor device may include a second isolation area located between the first region and the third region, where the encapsulation material includes a portion located within the second isolation area. The semiconductor device may include a first electrode coupled to the at least one terminal of the at least one first transistor, and a second electrode coupled to the at least one terminal of the at least one second transistor. The encapsulation material may include a portion that extends between an edge of the first electrode and an edge of the second electrode. The semiconductor device may include a backplate including a first region and a second region, where the first region of the backplate contacts the first region of the wafer substrate and the second region of the backplate contacts the second region of the wafer substrate. The encapsulation material may include a portion that extends between an edge of the first region and an edge of the second region. The encapsulation material may include a molding material. The encapsulation material may include a solder resist material. The at least one first transistor is a power field-effect transistor (FET), and the at least one second transistor is a sensor field effect transistor (FET).

According to an aspect, a semiconductor device for integrating multiple transistors includes a wafer substrate including a first region and a second region, where the first region defines at least a portion of at least one first transistor, and the second region defines at least a portion of at least one second transistor. The semiconductor device includes a backplate including a first region and a second region, where the first region of the backplate contacts the first region of the wafer substrate and the second region of the backplate contacts the second region of the wafer substrate. The semiconductor device includes an isolation area located between the first region of the wafer substrate and the second region of the wafer substrate, and an encapsulation material, where the encapsulation material includes a portion located within the isolation area.

According to some aspects, the semiconductor device may include one or more of the following features (or any combination thereof). The semiconductor device includes a first electrode coupled to a terminal of the first transistor, where the terminal contacts the first region of the wafer substrate, and a second electrode coupled to a terminal of the second transistor, where the terminal contacts the second region of the wafer substrate. The encapsulation material includes a portion that extends between an edge of the first electrode and an edge of the second electrode. The first region defines an edge, and the second region defines an edge, where the isolation area is located between the edge of the first region and the edge of the second region, and the edge of the second region is non-parallel with the edge of the first region. The at least one first transistor includes two first transistors, and the at least one second transistor includes two second transistors, where drains of the two first transistors are connected in series and drains of the two second transistors are connected in series. The encapsulation material may include a molding material. The encapsulation material may include a solder resist material. The isolation area may include a tapered via. The semiconductor device includes a metal pad contacting an end portion of the tapered via, where the metal pad contacts a portion of the first region and a portion of the second region. The at least one first transistor is a power field-effect transistor (FET), and the at least one second transistor is a sensor FET.

According to an aspect, a method for integrating multiple transistors in a semiconductor device includes providing a wafer substrate assembly, where the wafer substrate assembly includes a wafer substrate, a first electrode coupled to a first region of the wafer substrate, and a second electrode coupled to a second region of the wafer substrate. The method includes removing a portion of the wafer substrate located between the first electrode and the second electrode to create an isolation area and applying an encapsulation material to the wafer substrate assembly, including depositing a portion of the encapsulation material within the isolation area. In some examples, the method includes coupling a metal pad over the isolation area, where the metal pad contacts the first region and the second region.

The details of one or more implementations are set forth in the accompanying drawings and the description below. Other features will be apparent from the description and drawings, and from the claims.

BRIEF DESCRIPTION OF THE DRAWINGS

FIGS. 7A through 7L illustrate operations for creating a semiconductor device according to an aspect.

FIGS. 11A through 11K illustrate operations for creating a semiconductor device according to an aspect.

DETAILED DESCRIPTION

Figure 1A:
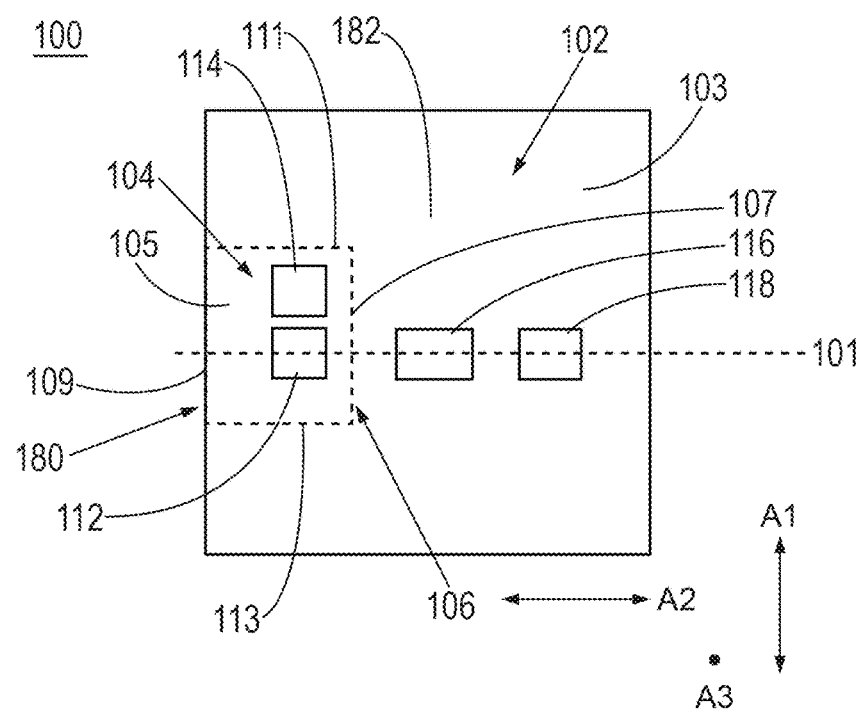
FIG. 1A illustrates a top view perspective of a semiconductor device having an isolation area to separate multiple devices according to an aspect.

The present disclosure relates to a semiconductor device that integrates multiple transistors on a single chip in a manner that isolates one or more transistors from another transistor. In some examples, the semiconductor device may include a sensor transistor (or multiple sensor transistors) and a power transistor (or multiple power transistors) on a single chip, where the sensor transistor(s) are isolated from the power transistor(s) via one or more isolation areas. In this manner, cross-conduction (or cross-talk) can be reduced or minimized between the power transistor(s) and the sensor transistor(s). In some examples, the sensor transistor(s) and/or the power transistor(s) include field effect transistor(s) (FET(s)). However, the semiconductor device may include any type of transistors (e.g., FETs) besides sensor transistors and power transistors. The isolation area includes an encapsulation material. In some examples, the encapsulation material includes a molding material and/or a solder resist material. In some examples, the semiconductor device includes a 2-in-1 low-voltage (LV) metal oxide silicon field effect transistor (MOSFET) (e.g., two devices in one chip). In some examples, the semiconductor device includes a 3-in-1 LV MOSFET (e.g., three devices in one chip). In some examples, the semiconductor device includes a 4-in-1 LV MOSFET (e.g., four devices in one chip). However, the embodiments discussed herein may include any number of devices integrated into the single chip, which may include more than four devices in one chip.

The semiconductor device may include a wafer substrate (e.g., a silicon substrate) that includes a first region and a second region. The first region may define or include at least a portion of a first transistor (or multiple first transistors). The second region may define or include at least a portion of a second transistor (or multiple second transistors). The semiconductor device includes an isolation area located between the first region and the second region. In some examples, the isolation area is a portion of the wafer substrate that has been removed during the manufacturing process. In some examples, a portion of the wafer substrate is removed from the top side of the wafer substrate via an etching process. In some examples, a via (e.g., a tapered via) is formed from the back side of the wafer substrate via an etching process.

The semiconductor device includes electrodes that extend from the top side of the wafer substrate. The semiconductor device includes a backplate coupled to the back side of the wafer substrate. In some examples, the backplate includes separate regions, where a first region of the backplate is coupled to the first region of the wafer substrate and a second region of the backplate is coupled to the second region of the wafer substrate.

The semiconductor device includes an encapsulation material, where a portion of the encapsulation material is located within the isolation area. In some examples, the encapsulation material includes a molding material and/or a solder resist material. The portion of the encapsulation material located within the isolation area may provide isolation between the second transistor(s) and the first transistor(s).

In some examples, in response to a portion of the wafer substrate being removed from the top side of the wafer substrate to create the isolation area, a molding material is applied to the isolation area from the top side of the wafer substrate, and the molding material extends to an area between the electrodes on the top side of the wafer substrate. In some examples, the molding material is applied to the back side of the wafer substrate, which includes applying the molding material to the backplate portions. In some examples, a solder resist material is applied to the back side of the wafer substrate, which includes applying the solder resist material to the backplate portions and to the molding material located within the isolation area.

In some examples, in response to a via (e.g., a tapered via) being formed from the back side of the wafer substrate to create the isolation area, a solder resist material is applied to the isolation area from the back side of the wafer substrate. In some examples, the solder resist material is applied to the back side of the wafer substrate, which includes applying the solder resist material to the backplate portions. In some examples, the molding material is applied to the back side of the wafer substrate, which includes applying the molding material to the backplate portions.

Figure 1B:
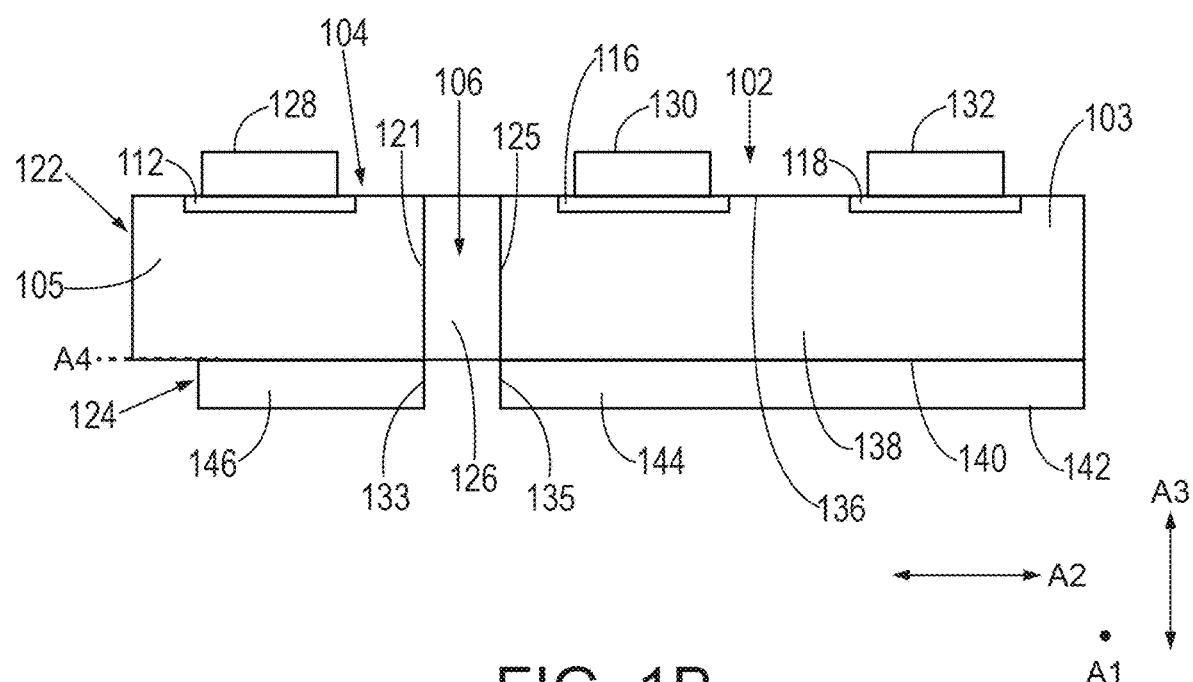
FIG. 1B illustrates a cross sectional view of the semiconductor device according to an aspect.
Figure 1C:
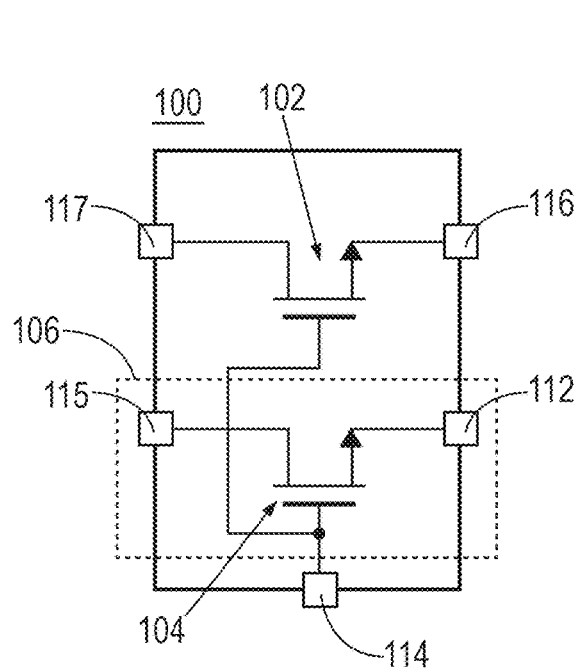
FIGS. 1C through 1E illustrate electrical diagrams of the semiconductor device according to various aspects.
Figure 1D:
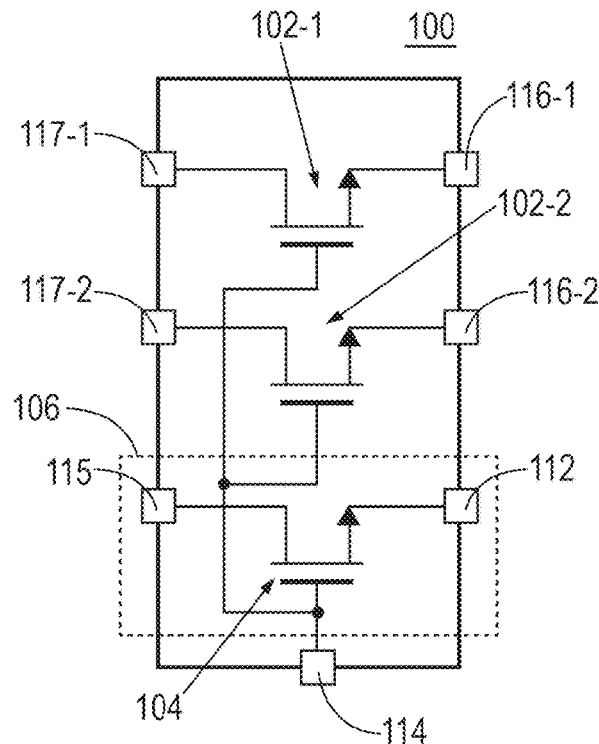
Figure 1E:
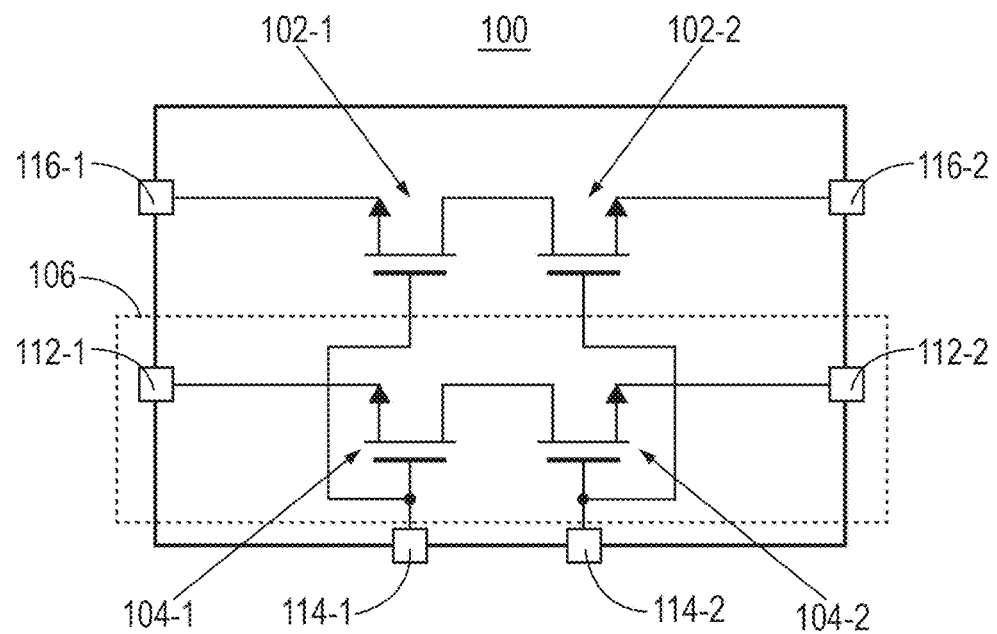

FIGS. 1A through 1E illustrate a semiconductor device 100 according to an aspect. FIG. 1A illustrates a top view perspective of the semiconductor device 100. FIG. 1B illustrates a cross-sectional view of the semiconductor device 100 of FIG. 1A taken along the line 101. FIGS. 1C through 1E illustrate electrical diagrams of the semiconductor device 100 according to various aspects. The semiconductor device 100 includes a transistor 102 and a transistor 104, where the transistor 104 is isolated from the transistor 102 via an isolation area 106. The transistor 102 may be any type of transistor such as a bipolar junction transistor (BJT)

or field effect transistor (FET). The transistor 104 may be any type of transistor such as a BJT or FET. In some examples, the transistor 102 is a power transistor (or main transistor). In some examples, the transistor 102 is a power FET. In some examples, the transistor 102 represents multiple FETs (e.g., a pair of FETs). In some examples, the transistor 104 is a sensor FET. In some examples, the transistor 104 represents multiple FETs (e.g., a pair of FETs).

The semiconductor device 100 may be a low-voltage semiconductor chip having a power FET (or multiple power FETs) and a sensor FET (or multiple sensor FETs), where the sensor FET(s) are integrated into the same chip as the power FET(s) but the sensor FET(s) are isolated from the power FET(s) via the isolation area 106. In some examples, the semiconductor device 100 is used for battery protection in a computing device such as a smartphone, tablet, laptop, etc. In some examples, the semiconductor device 100 includes a 2-in-1 low-voltage (LV) metal oxide silicon field effect transistor (MOSFET) (e.g., two devices in one chip).

As shown in FIG. 1B, the semiconductor device 100 includes a wafer substrate 122. The wafer substrate 122 includes a silicon material (e.g., crystalline silicon (c-Si)). The wafer substrate 122 includes a first surface 136 and a second surface 138. In some examples, the first surface 136 is considered a top surface (or top side) of the wafer substrate 122. In some examples, the second surface 138 is considered a bottom surface (or back side) of the wafer substrate 122. In some examples, the first surface 136 is a source side of the wafer substrate (e.g., having the sources of the transistors), and the second surface 138 is a drain side of the wafer substrate (e.g., having the drains of the transistors).

The second surface 138 may be disposed in parallel with the first surface 136. The second surface 138 is disposed in a plane A4. The distance between the first surface 136 and the second surface 138 may define the thickness of the wafer substrate 122 in a direction A3. The direction A3 is aligned perpendicular to the plane A4, and a direction A2 is perpendicular to the direction A3. A direction A1 is orthogonal to directions A1 and A2. As shown in FIG. 1A, the direction A3 is depicted into the page (shown as a dot). However, since FIG. 1B is a cross-sectional view, the direction A1 on FIG. 1B is depicted into the page (as shown as a dot).

The wafer substrate 122 includes a first region 103 and a second region 105. The first region 103 may define (or include) the transistor 102 (or at least a portion thereof). The second region 105 may define (or include) the transistor 104 (or at least a portion thereof). The semiconductor device 100 includes one or more electrical terminals (e.g., 116, 118) for the transistor 102. An electrical terminal may correspond to a gate, source, or drain of a respective transistor. The second region 105 is separated from the first region 103 via the isolation area 106. The first region 103 may be the portion of the wafer substrate 122 that extends away from the isolation area 106 starting at the edge 125 in the direction A2 and between the first surface 136 and the second surface 138 in the direction A3. The second region 105 may be the portion of the wafer substrate 122 that extends away from the isolation area 106 starting at the edge 121 in the direction A2 and between the first surface 136 and the second surface 138 in the direction A3.

The semiconductor device 100 may include an electrical terminal 116 associated with the transistor 102 and an electrical terminal 118 associated with the transistor 102. In some examples, the electrical terminal 116 is a source terminal. In some examples, the electrical terminal 116 is a gate terminal or a drain terminal. In some examples, the electrical terminal 118 is a gate terminal. In some examples, the electrical terminal 118 is a source contact or a drain contact. The electrical terminal 116 contacts (or is coupled to or embedded within) the first region 103 of the wafer substrate 122. In some examples, the electrical terminal 116 contacts (or is embedded within) the first surface 136 of the wafer substrate 122. The electrical terminal 118 contacts (or is coupled to or is embedded within) the first region 103 of the wafer substrate 122. In some examples, the electrical terminal 118 contacts (or is embedded within) the first surface 136 of the wafer substrate 122.

The semiconductor device 100 includes an electrode 130 coupled to the electrical terminal 116, and an electrode 132 coupled to the electrical terminal 118. The electrode 130 and the electrode 132 may extend from the first surface 136 of the wafer substrate 122 in the direction A3. Each of the electrode 130 and the electrode 132 may include one or more metal-based layers. In some examples, each of the electrode 130 and the electrode 132 include a first metal-based layer coupled to a respective electrical terminal and a second metal-based layer coupled to the first metal-based layer, where the second metal-based layer is different from the first metal-based layer. In some examples, the first metal-based layer includes an aluminum copper alloy material. In some examples, the second metal-based layer includes a nickel aluminum alloy material. In some examples, each of the electrode 130 and the electrode 132 includes a third metal-based layer coupled to the second metal-based layer. In some examples, the third metal-based layer includes a conductive bump material such as solder and/or gold bumps.

The semiconductor device 100 may include an electrical terminal 112 associated with the transistor 104, and an electrical terminal 114 associated with the transistor 104. In some examples, the electrical terminal 112 is a source contact. In some examples, the electrical terminal 112 is a gate contact or a drain contact. In some examples, the electrical terminal 114 is a gate contact. In some examples, the electrical terminal 114 is a source contact or a drain contact. The electrical terminal 112 contacts (or is coupled to or embedded within) the second region 105 of the wafer substrate 122. In some examples, the electrical terminal 112 contacts (or is embedded within) the first surface 136 of the wafer substrate 122. The electrical terminal 114 contacts (or is coupled to or embedded within) the second region 105 of the wafer substrate 122. In some examples, the electrical terminal 114 contacts (or is embedded within) the first surface 136 of the wafer substrate 122.

The semiconductor device 100 includes an electrode 128 coupled to the electrical terminal 112, and an electrode (not shown in FIG. 1B) coupled to the electrical terminal 114. The electrode 128 may extend from the first surface 136 of the wafer substrate 122 in the direction A3. The electrode 128 may include one or more metal-based layers. In some examples, the electrode 128 includes a first metal-based layer coupled to the electrical terminal 112 and a second metal-based layer coupled to the first metal-based layer, where the second metal-based layer is different from the first metal-based layer. In some examples, the first metal-based layer includes an aluminum copper alloy material. In some examples, the second metal-based layer includes a nickel aluminum alloy material. In some examples, the electrode 128 includes a third metal-based layer coupled to the second metal-based layer. In some examples, the third metal-based layer includes a conductive bump material such as solder and/or gold bumps.

The semiconductor device 100 includes a backplate 124 coupled to the wafer substrate 122. The backplate 124 includes a metallization material. In some examples, the backplate 124 includes a copper material. In some examples, the backplate 124 is formed on the second surface 138 of the wafer substrate 122 via a copper plating processing. In some examples, the backplate 124 is formed on the second surface 138 of the wafer substrate 122 via copper photoresist, copper plating, and copper etching process. The backplate 124 is coupled to the back side of the wafer substrate 122. The backplate 124 includes a first surface 140 and a second surface 142. The distance between the first surface 140 and the second surface 142 in the direction A3 may define the thickness of the backplate 124. The first surface 140 of the backplate 124 may be coupled to the second surface 138 of the wafer substrate 122. The backplate 124 may include a first region 144 and a second region 146. In some examples, the second region 146 is separate and disposed away from the first region 144. The first region 144 of the backplate 124 is coupled to the first region 103 of the wafer substrate 122. The second region 146 of the backplate 124 is coupled to the second region 105 of the wafer substrate 122.

The semiconductor device includes an isolation area 106 located between the first region 103 and the second region 105. In some examples, as shown in FIG. 1A, the isolation area 106 is disposed around (e.g., partially around or fully around) the second region 105 of the wafer substrate 122. In some examples, the isolation area 106 includes a portion 107 that extends in the direction A1, a portion 111 that extends in the direction A2, and a portion 113 that extends in the direction A2. In some examples, the isolation area 106 includes a portion 109 that extends in the direction A1. In some examples, the portion 107 and the portion 109 are opposite sides of the isolation area 106. In some examples, the portion 111 and the portion 113 are opposite sides of the isolation area 106. In some examples, the portion 109 extends along an outer edge 180 (or is proximate to the outer edge 180) of the semiconductor device 100 in the direction A1. The portion 111 connects to the portion 109, and the portion 111 extends from the outer edge 180 towards a central area 182 of the semiconductor device 100 in the direction A2. The portion 107 connects to the portion 111 and extends in the direction A1. The portion 113 is connected to the portion 107 and extends in the direction A2 towards the outer edge 180.

The isolation area 106 may extend in the A3 direction as shown in FIG. 1B. In some examples, the isolation area 106 is defined (at least in part) by three portions (e.g., 107, 111, 113). In some examples, the isolation area 106 is defined (at least in part) by four portions (e.g., 107, 109, 111, 113). In some examples, the portion 107, the portion 111, the portion 113, and/or the portion 109 are linear. In some examples, the portion 107, the portion 111, the portion 113, and/or the portion 109 includes one or more bent regions.

Referring to FIG. 1B, in some examples, the isolation area 106 is a space between an edge 121 of the second region 105 and an edge 125 of the first region 103. The edge 121 and the edge 125 extends in the direction A3. In some examples, the isolation area 106 includes a cut-out portion between the first region 103 and the second region 105. For example, as further described later in the disclosure, a portion of the wafer substrate 122 may be removed to create at least a portion of the isolation area 106. In some examples, the isolation area 106 is formed by dry etch, wet etch, laser sawing, and/or mechanical blade sawing to create the isolation area 106. In some examples, the portion between the edge 121 and the edge 125 is removed from the top side of the wafer substrate 122. In some examples, the portion between the edge 121 and the edge 125 is removed from the back side of the wafer substrate 122. In some examples, the isolation area 106 is a via (e.g., empty space which is then filled within the encapsulation material 126) that extends from the first surface 136 of the wafer substrate 122 to the second surface 138 of the wafer substrate 122. In some examples, the via is tapered (e.g., having a larger width (in the direction A2) either towards the first surface 136 or the second surface 138).

The semiconductor device 100 includes an encapsulation material 126. In some examples, the encapsulation material 126 is formed from a liquid encapsulation. In some examples, the encapsulation material 126 includes a molding material. In some examples, the encapsulation material 126 includes one or more types of material (e.g., in a molding compound if including multiple types of materials) such as a metal, a plastic, a resin, an epoxy, a phenolic hardener, a silica material, a pigment, a glass, a ceramic casing, and/or so forth. In some examples, the encapsulation material 126 includes a solder resist material. In some examples, the encapsulation material 126 includes a molding material and a solder resist material.

The encapsulation material 126 is disposed within the isolation area 106. For example, the encapsulation material 126 may extend from the edge 133 to the edge 135 in the direction A2. The encapsulation material 126 may extend from the first surface 136 to the second surface 138 in the direction A3. The encapsulation material 126 may provide isolation between the first region 103 and the second region 105, thereby isolating the transistor 104 from the transistor 102.

FIG. 1C illustrates an electrical diagram of the semiconductor device 100 according to an aspect. The semiconductor device 100 of FIG. 1C may integrate two transistors (e.g., transistor 102, transistor 104) into a single chip, where one of the transistors (e.g., transistor 104) is isolated from the other transistor (e.g., transistor 102). As shown in FIG. 1C, the transistor 104 is disposed in parallel with the transistor 102, where the transistor 104 is isolated from the transistor 102 via the isolation area 106 as explained with reference to FIGS. 1A and 1B. The semiconductor device 100 of FIG. 1C includes an electrical terminal 116 coupled to a source of the transistor 102, and an electrical terminal 117 coupled to a drain of the transistor 102. The semiconductor device 100 includes an electrical terminal 112 coupled to a source of the transistor 104, and an electrical terminal 115 coupled to a drain of the transistor 104. The gates of the transistor 102 and the transistor 104 are coupled to an electrical terminal 114. In some examples, a separate electrical terminal is provided for each of the gates of the transistor 102 and the transistor 104.

FIG. 1D illustrates an electrical diagram of the semiconductor device 100 according to another aspect. The semiconductor device 100 of FIG. 1D may integrate three transistors (e.g., transistor 102-1, transistor 102-2, transistor 104) into a single chip, where one of the transistors (e.g., transistor 104) is isolated from the other transistors (e.g., transistor 102-1, transistor 102-2). As shown in FIG. 1D, the transistor 102-1, the transistor 102-2, and the transistor 104 are disposed in parallel with each other, where the transistor 104 is isolated from the transistor 102-1 and the transistor 102-2 via the isolation area 106 as explained with reference to FIGS. 1A and 1B. The semiconductor device 100 of FIG. 1D includes an electrical terminal 116-1 coupled to a source of the transistor 102-1, and an electrical terminal 117-1 coupled to a drain of the transistor 102-1. The semiconductor device 100 includes an electrical terminal 116-2 coupled to a source of the transistor 102-2, and an electrical terminal 117-2 coupled to a drain of the transistor 102-2. The semiconductor device 100 includes an electrical terminal 112 coupled to a source of the transistor 104, and an electrical terminal 115 coupled to a drain of the transistor 104. The gates of the transistor 102-1, the transistor 102-2, and the transistor 104 are coupled to an electrical terminal 114. In some examples, a separate electrical terminal is provided for each of the gates of the transistor 102-1, the transistor 102-2, and the transistor 104.

FIG. 1E illustrates an electrical diagram of the semiconductor device 100 according to another aspect. The semiconductor device 100 of FIG. 1E may integrate four transistors (e.g., transistor 102-1, transistor 102-2, transistor 104-1, transistor 104-2) into a single chip, where a pair of transistors (e.g., transistor 104-1, transistor 104-2) is isolated from the other pair of transistors (e.g., transistor 102-1, transistor 102-2). As shown in FIG. 1E, the drains of transistor 102-1 and the transistor 102-2 are coupled together, and the drains of transistor 104-1 and the transistor 104-2 are coupled together. The pair of transistors 104-1, 104-2 are disposed in parallel with the pair of transistors 102-1, 102-2, where the pair of transistors 104-1, 104-2 are separated from the pair of transistors 102-1, 102-2 via the isolation area 106 explained with reference to FIGS. 1A and 1B. The semiconductor device 100 of FIG. 1E includes an electrical terminal 116-1 coupled to a source of the transistor 102-1, and an electrical terminal 116-2 coupled to a source of the transistor 102-2. The semiconductor device 100 includes an electrical terminal 112-1 coupled to a source of the transistor 104-1, and an electrical terminal 112-2 coupled to a source of the transistor 104-2. In some examples, the gates of the transistor 102-1 and the transistor 104-1 are coupled to an electrical terminal 114-1 (e.g., the gates of the transistor 102-1 and the transistor 104-1 are coupled together). In some examples, the gates of the transistor 102-2 and the transistor 104-2 are coupled to an electrical terminal 114-2 (e.g., the gates of the transistor 102-2 and the transistor 104-2 are coupled together).

Figure 2:
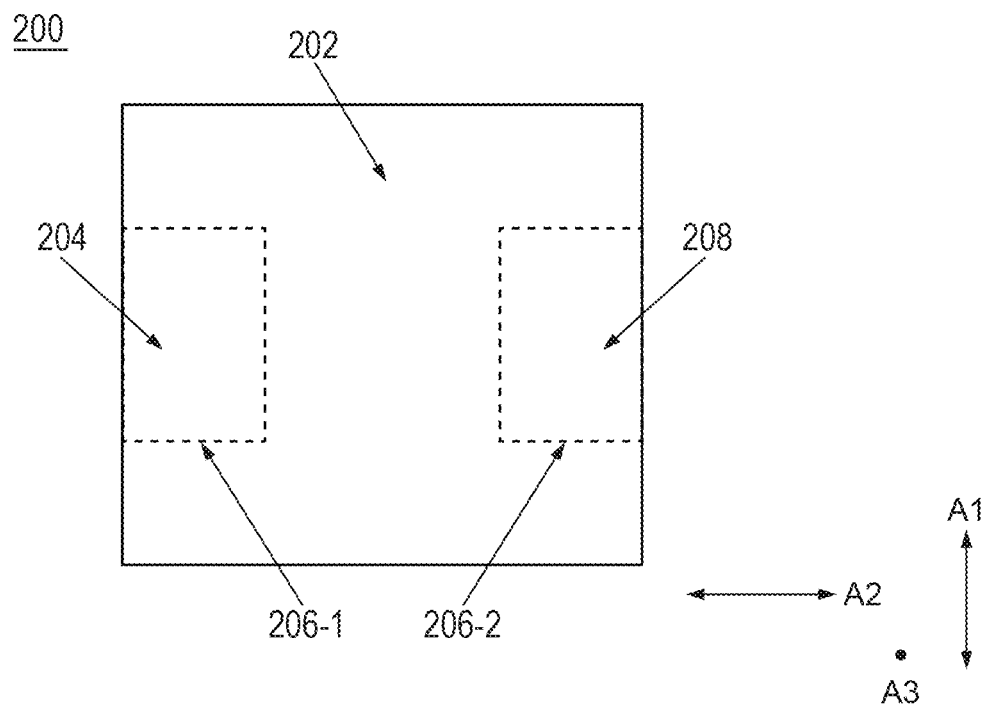
FIG. 2 illustrates a semiconductor device that integrates three devices according to an aspect.

FIG. 2 illustrates a semiconductor device 200 according to an aspect. The semiconductor device 200 may be an example of the semiconductor device 100 of FIGS. 1A through 1E and may include any of the details discussed with reference to those figures. The semiconductor device 200 may integrate three devices on a single chip. The semiconductor device 200 may include a transistor 202, a transistor 204, and a transistor 208, where the transistor 204 is isolated from the transistor 202 via a first isolation area 206-1 and the transistor 208 is isolated from the transistor 202 via a second isolation area 206-2. In some examples, the transistor 204 and the transistor 208 are integrated into the transistor 202, but the isolation that is provided by the first isolation area 206-1 and the second isolation area 206-2 isolates the transistor 204 and the transistor 208 from the transistor 202.

In some examples, the transistor 202, the transistor 204, and the transistor 208 are different FETs. In some examples, the transistor 202 is a power FET. In some examples, the transistor 204 is a sensor FET. In some examples, the transistor 204 is a power FET. In some examples, the transistor 208 is a sensor FET. In some examples, the transistor 208 is a power FET. In some examples, the transistor 202 represents multiple transistors (e.g., a pair of transistors). In some examples, the transistor 204 represents multiple transistors (e.g., a pair of transistors). In some examples, the transistor 208 represents multiple transistors (e.g., a pair of transistors). In some examples, the semiconductor device 200 is a low-voltage semiconductor chip having one or more power FETs and one or more sensor FETs. In some examples, the semiconductor device 100 is a low-voltage semiconductor chip for battery protection. In some examples, the semiconductor device 200 is a 3-in-1 low-voltage semiconductor chip (e.g., three devices in one chip).

Figure 3:
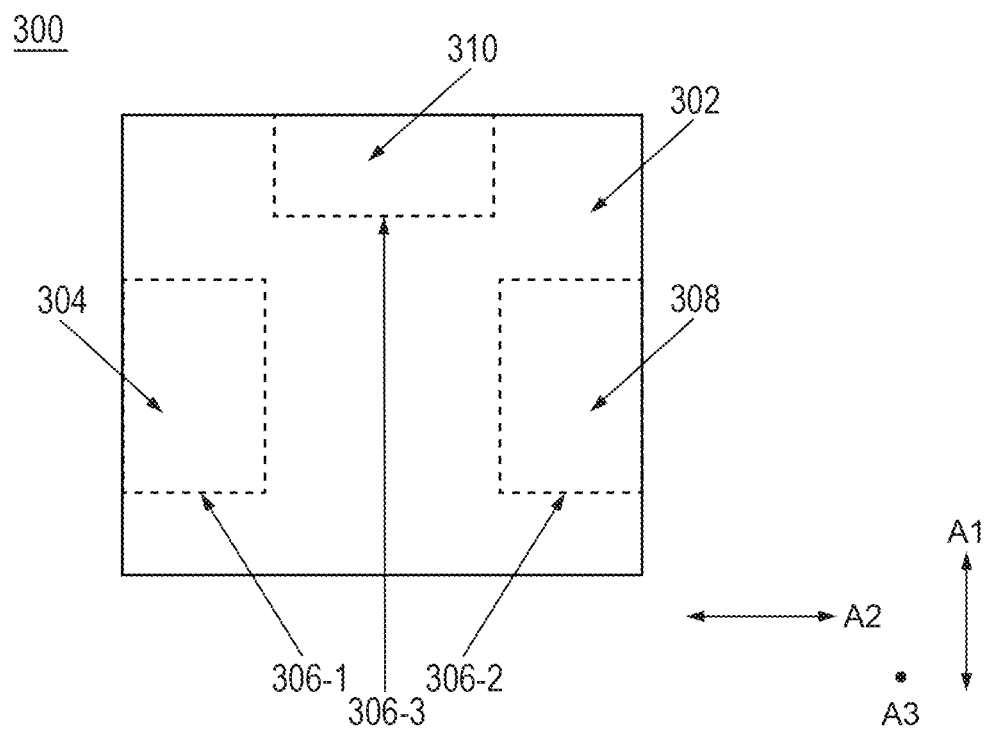
FIG. 3 illustrates a semiconductor device that integrates four devices according to an aspect.

FIG. 3 illustrates a semiconductor device 300 according to an aspect. The semiconductor device 300 may be an example of the semiconductor device 100 of FIGS. 1A through 1E and/or the semiconductor device 200 of FIG. 2 and may include any of the details discussed with reference to those figures. The semiconductor device 300 may integrate four devices on a single chip. The semiconductor device 300 may include a transistor 302, a transistor 304, a transistor 308, and a transistor 310, where the transistor 304 is isolated from the transistor 302 via a first isolation area 306-1, the transistor 308 is isolated from the transistor 302 via a second isolation area 306-2, and the transistor 310 is isolated from the transistor 302 via a third isolation area 306-3. In some examples, the transistor 304, the transistor 308, and the transistor 310 are integrated into the transistor 302, but the isolation that is provided by the first isolation area 306-1, the second isolation area 306-2, and the third isolation area 306-3 isolate the transistor 304, the transistor 308, and the transistor 310 from the transistor 302.

In some examples, the transistor 302 is a power FET. In some examples, the transistor 304 is a sensor FET. In some examples, the transistor 304 is a power FET. In some examples, the transistor 308 is a sensor FET. In some examples, the transistor 308 is a power FET. In some examples, the transistor 310 is a sensor FET. In some examples, the transistor 310 is a power FET. In some examples, the transistor 302 is a power FET, and the transistor 304, the transistor 308, and the transistor 310 are sensor FETs. In some examples, the transistor 302 represents multiple transistors (e.g., a pair of transistors). In some examples, the transistor 304 represents multiple transistors (e.g., a pair of transistors). In some examples, the transistor 308 represents multiple transistors (e.g., a pair of transistors). In some examples, the transistor 310 represents multiple transistors (e.g., a pair of transistors). In some examples, the semiconductor device 300 is a low-voltage semiconductor chip having one or more power FETs and one or more sense FETs. In some examples, the semiconductor device 300 is a low-voltage semiconductor chip for battery protection. In some examples, the semiconductor device 300 is a 4-in-1 low-voltage semiconductor chip (e.g., four devices integrated on a single chip).

Figure 4A:
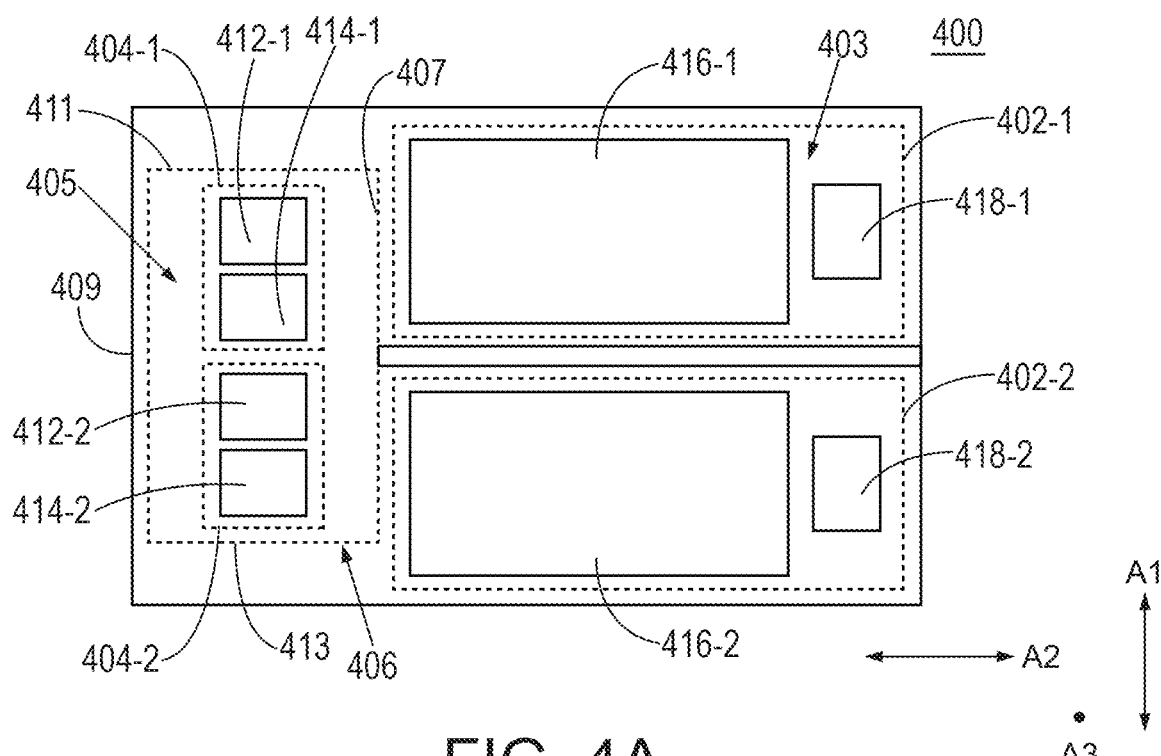
FIGS. 4A through 4B illustrate top view perspectives of semiconductor devices according to various aspects.
Figure 4B:
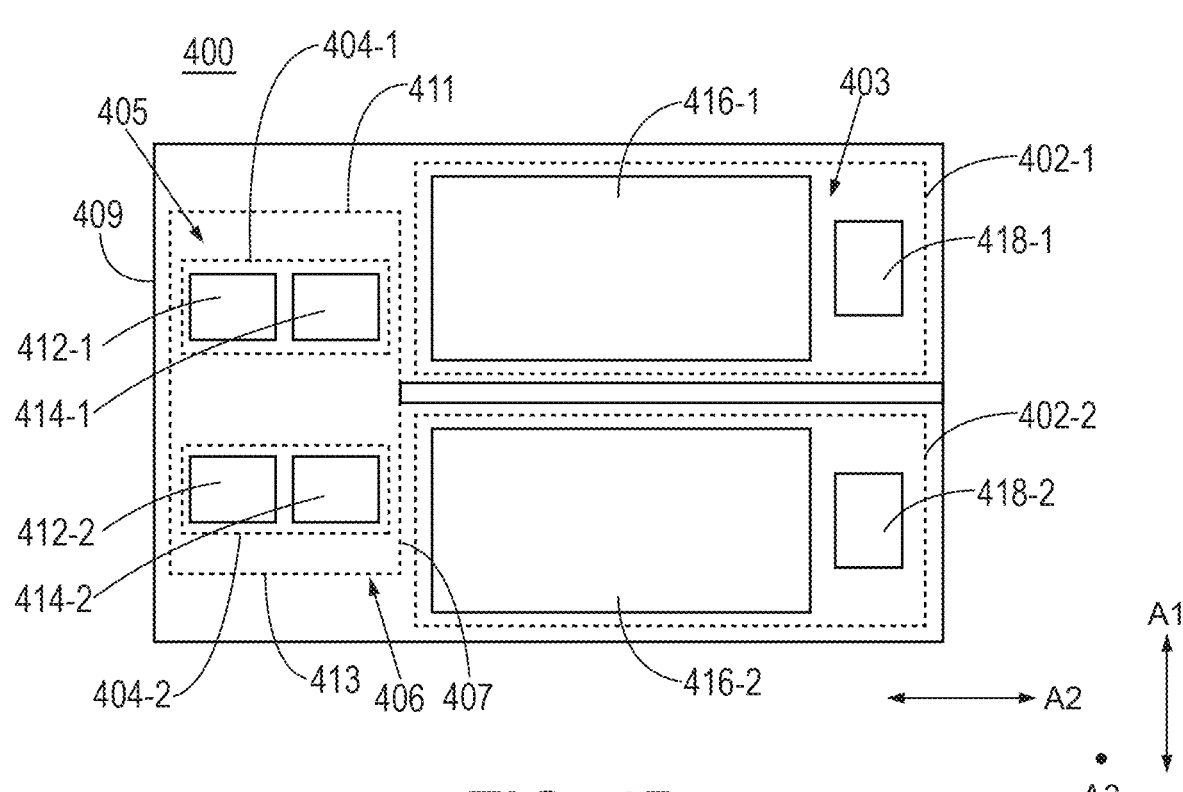

FIGS. 4A through 4B illustrate a semiconductor device 400 according to an aspect. The semiconductor device 400 includes a first sensor transistor 404-1, a second sensor transistor 404-2, a first power transistor 402-1, and a second power transistor 402-2. The semiconductor device 400 of FIGS. 4A through 4B may include any of the details of the semiconductor device 100 of FIGS. 1A through 1E, the semiconductor device 200 of FIG. 2, and/or the semiconductor device 300 of FIG. 3 and may include any of the details discussed with reference to those figures. The first sensor transistor 404-1 and the second sensor transistor 404-2 may be examples of the transistor 104 of FIGS. 1A through 1E, the transistor 204 of FIG. 2, and/or the transistor 304 of FIG. 3. The first power transistor 402-1 and the second power transistor 402-2 may be examples of the transistor 102 of FIGS. 1A through 1E, the transistor 202 of FIG. 2, and/or the transistor 302 of FIG. 3.

In some examples, the second power transistor 402-2 is the same as the first power transistor 402-1. In some examples, the second power transistor 402-2 is different from the first power transistor 402-1. In some examples, the second sensor transistor 404-2 is the same as the first sensor transistor 404-1. In some examples, the second sensor transistor 404-2 is different from the first sensor transistor 404-1. In some examples, the pair of sensor transistors (404-1, 404-2) have the same voltage source supply (VSS) rating as the pair of power transistors (402-1, 402-2). In some examples, the die size of the pair of sensor transistors (404-1, 404-2) is smaller than the die size of the pair of power transistors (402-1, 402-2). In some examples, the static source-to-source on-state resistance (RSS(on)) of the pair of sensor transistors (404-1, 404-2) is higher than the RSS(on) of the pair of power transistors (402-1, 402-2).

FIGS. 4A and 4B illustrate different contact layouts for the sources and gates of the first sensor transistor 404-1, the second sensor transistor 404-2, the first power transistor 402-1, and the second power transistor 402-2. FIGS. 4A and 4B are top view perspectives of the semiconductor device 400. In the example of FIG. 4A, the source and gate terminals (e.g., 412-1, 414-1, 412-2, 414-2) for the first sense transistor 404-1 and the second sense transistor 404-2 are arranged according to a first contact layout. In the example of FIG. 4B, the source and gate terminals (e.g., 412-1, 414-1, 412-2, 414-2) for the first sensor transistor 404-1 and the second sensor transistor 404-2 are arranged according to a second layout. However, it is noted that the source and gate contacts may be arranged according to any type of contact layout.

In some examples, the drains of the first sensor transistor 404-1 and the second sensor transistor 404-2 are connected in series with each other, and the drains of the first power transistor 402-1 and the second power transistor 402-2 are connected in series with each other. The first and second sensor transistors 404-1, 404-2 are connected in parallel with the first and second power transistors 402-1, 402-2. The source of the first sensor transistor 404-1 is connected to an electrical terminal 412-1. The source of the second sensor transistor 404-2 is connected to an electrical terminal 412-2. The source of the first power transistor 402-1 is connected to an electrical terminal 416-1. The source of the second power transistor 402-2 is connected to an electrical terminal 416-2.

In some examples, a separate gate terminal is provided for each of the first power transistor 402-1, the second power transistor 402-1, the first sensor transistor 404-1, and the second sensor transistor 404-2. For example, the gate of the first sensor transistor 404-1 is connected to an electrical terminal 414-1. The gate of the second sensor transistor 404-2 is connected to an electrical terminal 414-2. The gate of the first power transistor 402-1 is connected to an electrical terminal 418-1. The gate of the second power transistor 402-2 is connected to an electrical terminal 418-2.

In some examples, the semiconductor device 400 includes a single set of gate terminals for the pairs of transistors. For example, the gate of the first power transistor 402-1 is connected to the gate of the first sensor transistor 404-1. The gate of the first power transistor 402-1 and the gate of the first sensor transistor 404-1 is connected to the electrical terminal 414-1. The gate of the second power transistor 402-2 is connected to the gate of the second sensor transistor 404-2. The gate of the second power transistor 402-2 and the gate of the second sensor transistor 404-2 is connected to the electrical terminal 414-2.

The first power transistor 402-1 and the second power transistor 402-1 are defined by at least a first region 403 of a wafer substrate. The first sensor transistor 404-1 and the second sensor transistor 404-2 are defined by at least a second region 405 of the wafer substrate). The sensor transistors (404-1, 404-2) are isolated from the power transistors (402-1, 402-2) via an isolation area 406. For example, the isolation area 406 is disposed around (e.g., partially around or fully around) the second region 405. In some examples, the isolation area 406 includes a portion 407 that extends in the direction A1, a portion 411 that extends in the direction A2, and a portion 413 that extends in the direction A2. In some examples, the isolation area 106 includes a portion 409 that extends in the direction A1. In some examples, the portion 407, the portion 411, the portion 413, and/or the portion 409 are linear. In some examples, the portion 407, the portion 411, the portion 413, and/or the portion 409 includes one or more bent regions.

Figure 5A:
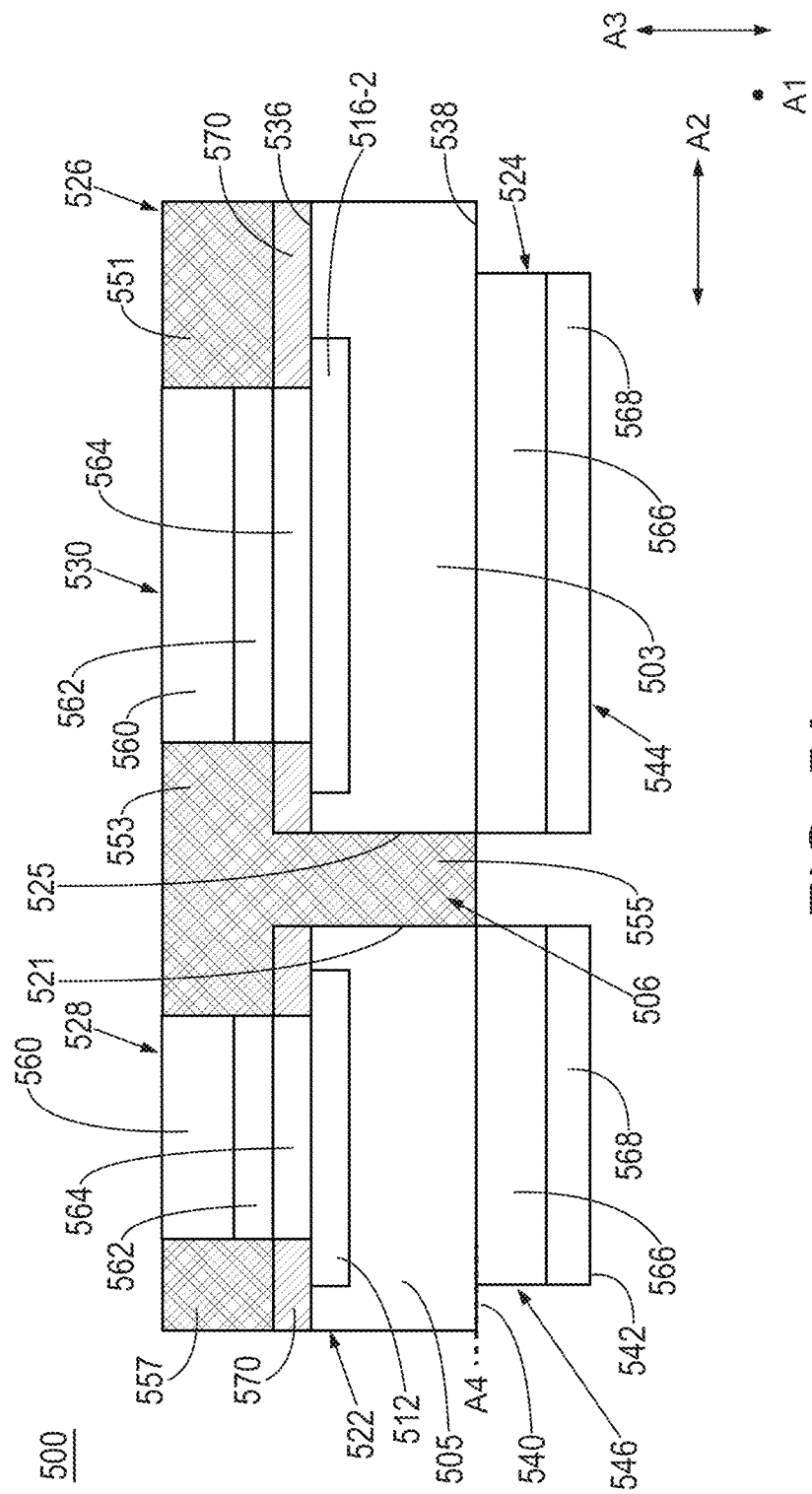
FIG. 5A illustrates a cross-sectional view of a semiconductor device having an isolation area filled with a molding material according to aspect.
Figure 5B:
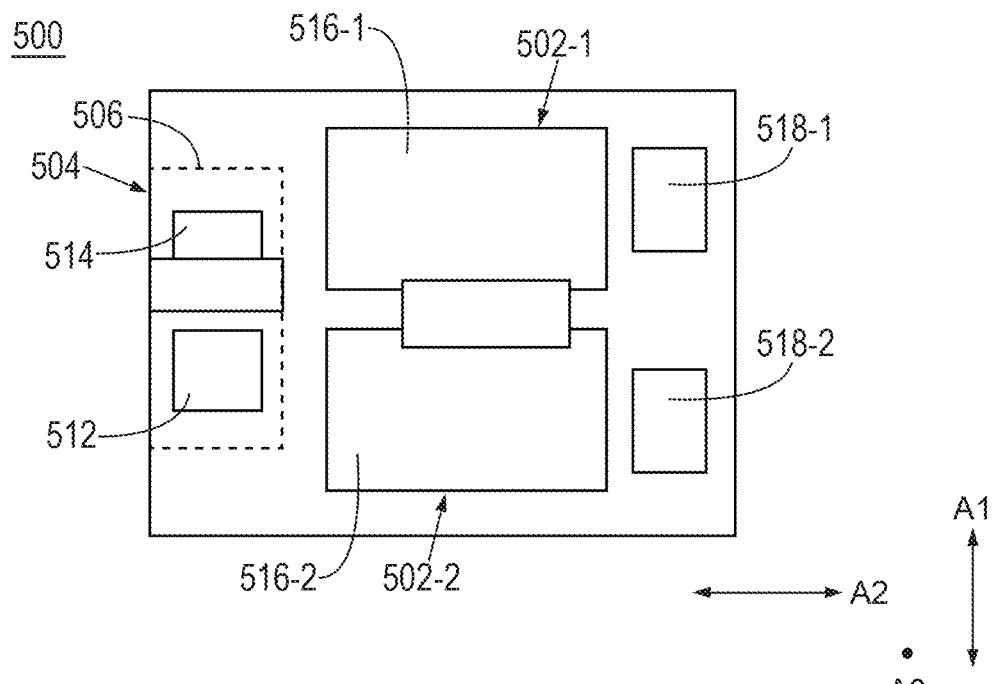
FIG. 5B illustrates a top view perspective of the semiconductor device of FIG. 5A according to an aspect.
Figure 5C:
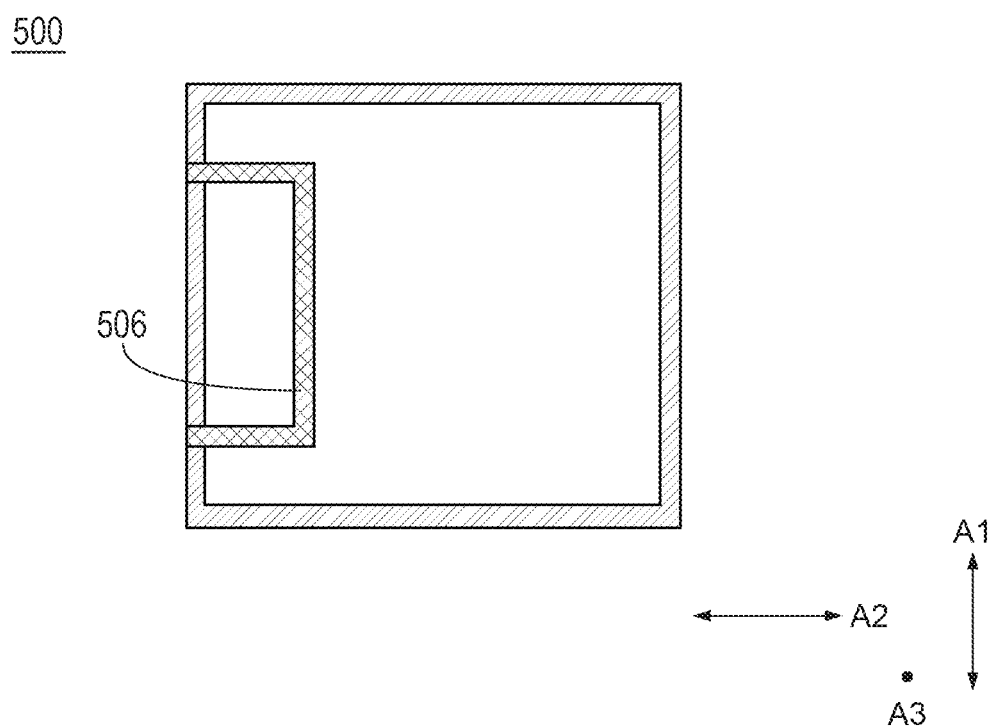
FIG. 5C illustrates a bottom view perspective of the semiconductor device of FIG. 5A according to an aspect.

FIGS. 5A through 5C illustrate a semiconductor device 500 according to an aspect. FIG. 5A illustrates a cross-sectional view of the semiconductor device 500. FIG. 5B illustrates a top view perspective of the semiconductor device 500. FIG. 5C illustrates a bottom view perspective of the semiconductor device 500. The semiconductor device 500 may be an example of the semiconductor device 100 of FIGS. 1A through 1E, the semiconductor device 200 of FIG. 2, the semiconductor device 300 of FIG. 3, and/or the semiconductor device 400 of FIGS. 4A through 4B and may include any of the details discussed with reference to those figures.

The semiconductor device 500 includes a wafer substrate 522. The wafer substrate 522 includes a silicon material (e.g., crystalline silicon (c-Si)). The wafer substrate 522 includes a first surface 536 and a second surface 538. In some examples, the second surface 538 is disposed in parallel with the first surface 536. The second surface 538 is disposed in a plane A4. The distance between the first surface 536 and the second surface 538 may define the thickness of the wafer substrate 522 in a direction A3.

The wafer substrate 522 includes a first region 503 and a second region 505. The first region 503 may define (or include) a transistor 502-1 (or at least a portion thereof) and a transistor 502-2 (or at least a portion thereof). In some examples, the transistor 502-1 and the transistor 502-2 are main power FETs. The second region 505 may define (or include) a transistor 504 (or at least a portion thereof). In some examples, the transistor 504 is a sensor FET. For example, the transistor 504 includes a source terminal 512 and a gate terminal 514. The transistor 502-1 includes a source terminal 516-1 and a gate terminal 518-1. The transistor 502-2 includes a source terminal 516-2 and a gate terminal 518-2.

As shown in FIG. 5A, an electrode 528 is coupled to the source terminal 512 of the transistor 504. The electrode 528 may extend from the first surface 536 of the wafer substrate 122 in the direction A3. Also, an electrode 530 is coupled to the source terminal 516-2 of the transistor 502-2. The electrode 530 may extend from the first surface 536 of the wafer substrate 522 in the direction A3. The electrode 528 and the electrode 530 may include one or more metal-based layers. For example, the electrode 528 and the electrode 530 may include a metal-based layer 564, a metal-based layer 562, and a metal-based layer 560. In some examples, the metal-based layer 564, the metal-based layer 562, and the metal-based layer 560 are different materials. In some examples, the metal-based layer 564 includes an aluminum copper alloy material. In some examples, the metal-based layer 562 includes a nickel aluminum alloy material. In some examples, the metal-based layer 560 includes a conductive bump material such as solder and/or gold bumps. In some examples, as shown in FIG. 5A, a dielectric material 570 (e.g., polyimide) is disposed on the first surface 536 of the wafer substrate 522.

The semiconductor device 500 includes a backplate 524 coupled to the wafer substrate 522. The backplate 524 includes a metallization material. In some examples, the backplate 524 includes a copper material and/or nickel material. In some examples, the backplate 524 is formed on the second surface 538 of the wafer substrate 522 via a copper plating process. In some examples, the backplate 524 is formed on the second surface 538 of the wafer substrate 522 via a copper photoresist, copper plating, and copper etching process. The backplate 524 is coupled to the backside of the wafer substrate 522. The backplate 524 includes a first surface 540 and a second surface 542. The distance between the first surface 540 and the second surface 542 in the direction A3 may define the thickness of the backplate 524. The first surface 540 of the backplate 524 may be coupled to the second surface 538 of the wafer substrate 522.

The backplate 524 may include a first region 544 and a second region 546. In some examples, the second region 546 is separate and disposed away from the first region 544. The first region 544 of the backplate 524 is coupled to the first region 503 of the wafer substrate 522. The second region 546 of the backplate 524 is coupled to the second region 505 of the wafer substrate 522. Each of the first region 544 and the second region 546 may include a metal-based layer 566 and a metal-based layer 568. In some examples, the metal-based layer 566 is copper. In some examples, the metal-based layer 568 is nickel.

The semiconductor device includes an isolation area 506 located between the first region 503 and the second region 505. The isolation area 506 is a space between an edge 521 of the second region 505 and an edge 525 of the first region 503. The edge 521 and the edge 525 extends in the direction A3. In some examples, the isolation area 506 includes a cut-out portion between the first region 503 and the second region 505. For example, a portion of the wafer substrate 522 may be removed to create at least a portion of the isolation area 506. In some examples, the isolation area 506 is formed by dry etch, wet etch, laser sawing, and/or mechanical blade sawing to create the isolation area 506.

The semiconductor device 500 includes a molding material 526. In some examples, the molding material 526 includes one or more types of material (e.g., in a molding compound if including multiple types of materials) such as a metal, a plastic, a resin, an epoxy, a phenolic hardener, a silica material, a pigment, a glass, a ceramic casing, and/or so forth. The molding material 526 includes a portion 555 disposed within the isolation area 506. For example, the portion 555 may extend between the edge 521 and the edge 525 in the direction A2. Also, the portion 555 may extend between the first surface 536 and the second surface 538 in the direction A3. The portion 555 of the molding material 526 may provide isolation between the first region 503 and the second region 505, thereby isolating the transistor 504 from the transistor 502-2. The molding material 526 includes a portion 553 that extends between the electrode 528 and the electrode 530. For example, the portion 553 may extend between an edge of the electrode 528 and an edge of the electrode 530 in the direction A2. Also, the portion 553 may extend from the first surface 536 to the top surface of the electrode 528 and the electrode 530 in the direction A3. The molding material 526 includes a portion 557 that extends from an edge of the electrode 528 to the edge of the semiconductor device 500, and a portion 551 that extends from an edge of the electrode 530 to the other edge of the semiconductor device 500.

Figure 6A:
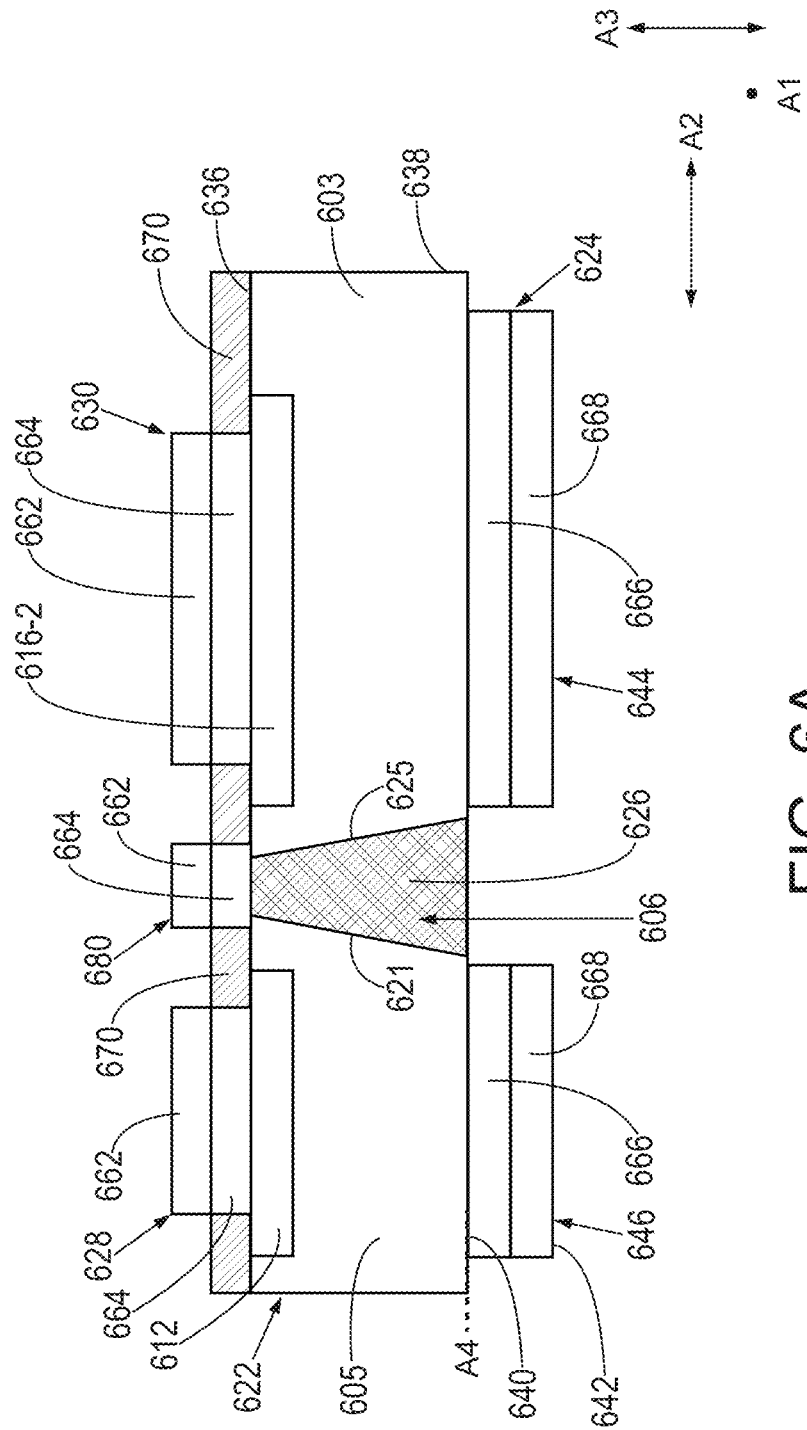
FIG. 6A illustrates a cross-sectional view of a semiconductor device having an isolation area filled with a solder resist material according to an aspect.
Figure 6B:
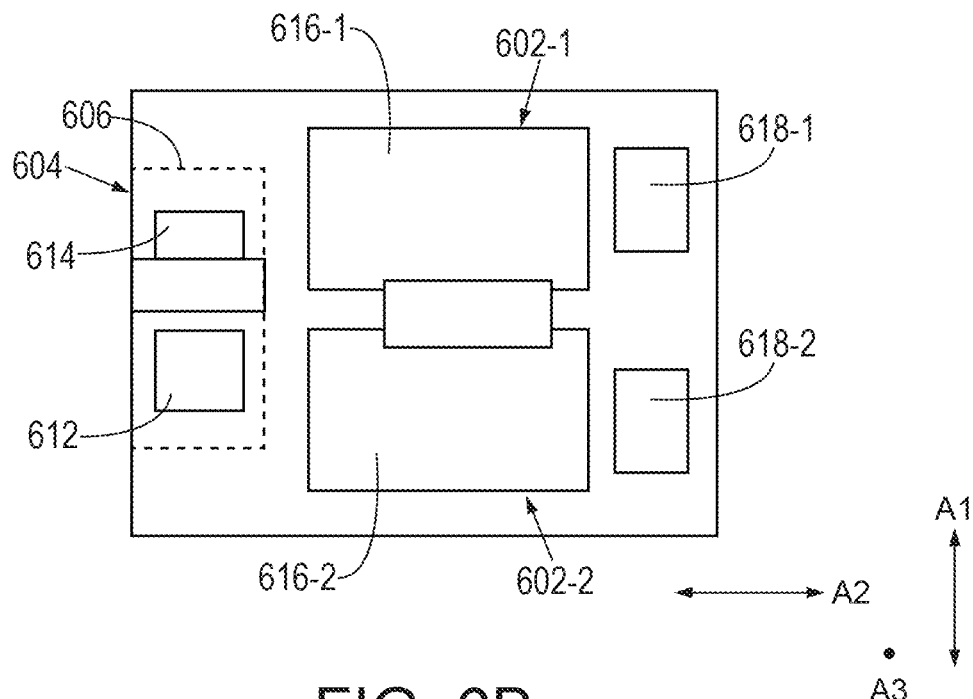
FIG. 6B illustrates a top view perspective of the semiconductor device of FIG. 6A according to an aspect.
Figure 6C:
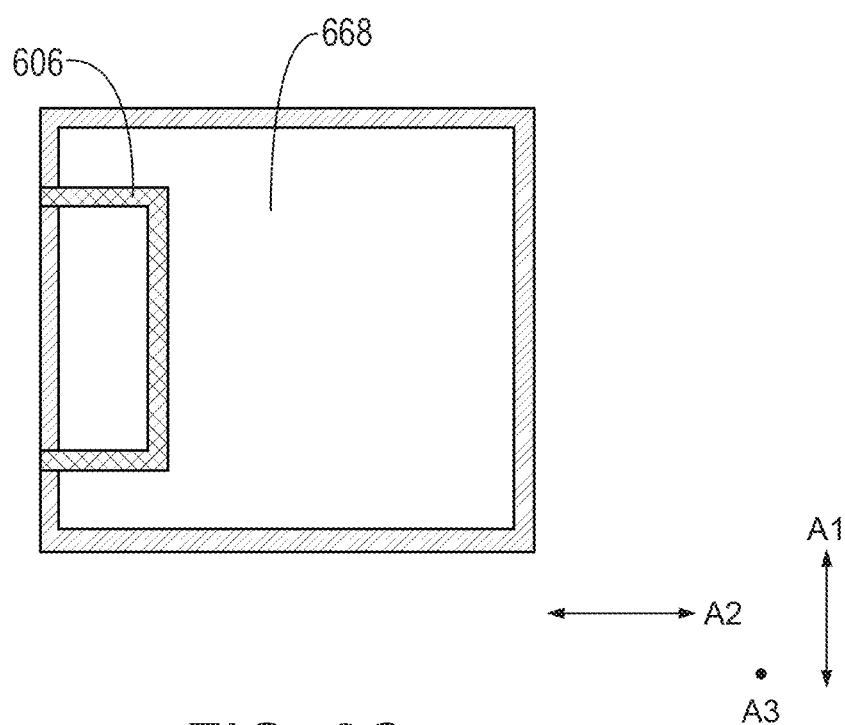
FIG. 6C illustrates a perspective of the semiconductor device of FIG. 6A according to an aspect.

FIGS. 6A through 6C illustrates a semiconductor device 600 according to an aspect. The semiconductor device 600 may be an example of the semiconductor device 100 of FIGS. 1A through 1E, the semiconductor device 200 of FIG. 2, the semiconductor device 300 of FIG. 3, the semiconductor device 400 of FIGS. 4A through 4B, and the semiconductor device 500 of FIGS. 5A through 5C and may include any of the details discussed with reference to those figures.

The semiconductor device 600 includes a wafer substrate 622. The wafer substrate 622 includes a silicon material (e.g., crystalline silicon (c-Si)). The wafer substrate 622 includes a first surface 636 and a second surface 638. In some examples, the second surface 638 is disposed in parallel with the first surface 636. The second surface 638 is disposed in a plane A4. The distance between the first surface 636 and the second surface 638 may define the thickness of the wafer substrate 622 in a direction A3.

The wafer substrate 622 includes a first region 603 and a second region 605. The first region 603 may define (or include) a transistor 602-1 (or at least a portion thereof) and a transistor 602-2 (or at least a portion thereof). In some examples, the transistor 602-1 and the transistor 602-2 are main power FETs. The second region 605 may define (or include) a transistor 604 (or at least a portion thereof). In some examples, the transistor 604 is a sensor FET. For example, the transistor 604 includes a source terminal 612 and a gate terminal 614. The transistor 602-1 includes a source terminal 616-1 and a gate terminal 618-1. The transistor 602-2 includes a source terminal 616-2 and a gate terminal 618-2.

As shown in FIG. 6A, an electrode 628 is coupled to the source terminal 612 of the transistor 604. The electrode 628 may extend from the first surface 636 of the wafer substrate 122 in the direction A3. Also, an electrode 630 is coupled to the source terminal 616-2 of the transistor 602-2. The electrode 630 may extend from the first surface 636 of the wafer substrate 622 in the direction A3. The electrode 628 and the electrode 630 may include one or more metal-based layers. For example, the electrode 628 and the electrode 630 may include a metal-based layer 664 and a metal-based layer 662. In some examples, the metal-based layer 664 and the metal-based layer 662 are different materials. In some examples, the metal-based layer 664 includes an aluminum copper alloy material. In some examples, the metal-based layer 662 includes a nickel aluminum alloy material. In some examples, as shown in FIG. 6A, a dielectric material 670 (e.g., polyimide) is disposed on the first surface 636 of the wafer substrate 622.

The semiconductor device 600 includes a backplate 624 coupled to the wafer substrate 622. The backplate 624 includes a metallization material. In some examples, the backplate 624 includes a copper material and/or nickel material. In some examples, the backplate 624 is formed on the second surface 638 of the wafer substrate 622 via a copper plating process. In some examples, the backplate 624 is formed on the second surface 638 of the wafer substrate 622 via a copper photoresist, copper plating, and copper etching process. The backplate 624 is coupled to the backside of the wafer substrate 622. The backplate 624 includes a first surface 640 and a second surface 642. The distance between the first surface 640 and the second surface 642 in the direction A3 may define the thickness of the backplate 624. The first surface 640 of the backplate 624 may be coupled to the second surface 638 of the wafer substrate 622.

The backplate 624 may include a first region 644 and a second region 646. In some examples, the second region 646 is separate and disposed away from the first region 644. The first region 644 of the backplate 624 is coupled to the first region 603 of the wafer substrate 622. The second region 646 of the backplate 624 is coupled to the second region 605 of the wafer substrate 622. Each of the first region 644 and the second region 646 may include a metal-based layer 666 and a metal-based layer 668. In some examples, the metal-based layer 666 is copper. In some examples, the metal-based layer 668 is nickel.

The semiconductor device includes an isolation area 606 located between the first region 603 and the second region 605. The isolation area 606 is a space between an edge 621 of the second region 605 and an edge 625 of the first region 603. The isolation area 606 defines a via (e.g., a cavity). In some examples, the via is tapered. In some examples, the edge 621 and the edge 625 are non-parallel with respect to each other. In some examples, the isolation area 606 has a larger width (e.g., in the direction A2) towards the second surface 638 than towards the first surface 636. In some examples, the via has a smaller width towards the second surface 638 than towards the first surface 636. The isolation area 606 includes a cut-out portion between the first region 603 and the second region 605. For example, a portion of the wafer substrate 622 may be removed to create at least a portion of the isolation area 606. In some examples, the isolation area 606 is formed by dry etch, wet etch, laser sawing, and/or mechanical blade sawing to create the isolation area 606.

The semiconductor device 600 includes a solder resist material 626. The solder resist material 626 is disposed within the isolation area 606. For example, the solder resist material 626 may extend between the edge 621 and the edge 625 in the direction A2. Also, the solder resist material 626 may extend between the first surface 636 and the second surface 638 in the direction A3. The solder resist material 626 may provide isolation between the first region 603 and the second region 605, thereby isolating the transistor 604 from the transistor 602-2. The semiconductor device 600 includes a metal pad 680 that contacts the isolation area 606. The metal pad 680 may contact the first surface 636 of the wafer substrate 622. The metal pad 680 may include the metal-based layer 664 and the metal-based layer 662. The metal pad 680 is configured to support the semiconductor device 600 at the part of the semiconductor device 600 that is trenched (e.g., that has the tapered via).

FIGS. 7A through 7L depict example fabrication operations for manufacturing a semiconductor device having isolated transistors(s). Although the fabrication operations of FIGS. 7A through 7L are discussed with reference to the semiconductor device 500 of FIGS. 5A through 5C, the fabrication operations of FIGS. 7A through 7L may be applicable to any of the semiconductor devices. Although the flowchart of FIGS. 7A through 7L illustrate operations in sequential order, it will be appreciated that this is merely an example, and that additional or alternative operations may be included. Further, operations of FIGS. 7A through 7L and related operations may be executed in a different order than that shown, or in a parallel or overlapping fashion.

Figure 7A:
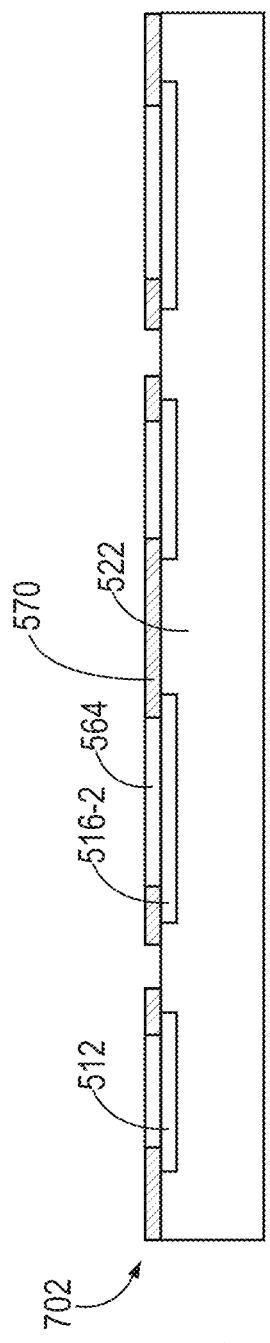
Figure 7B:
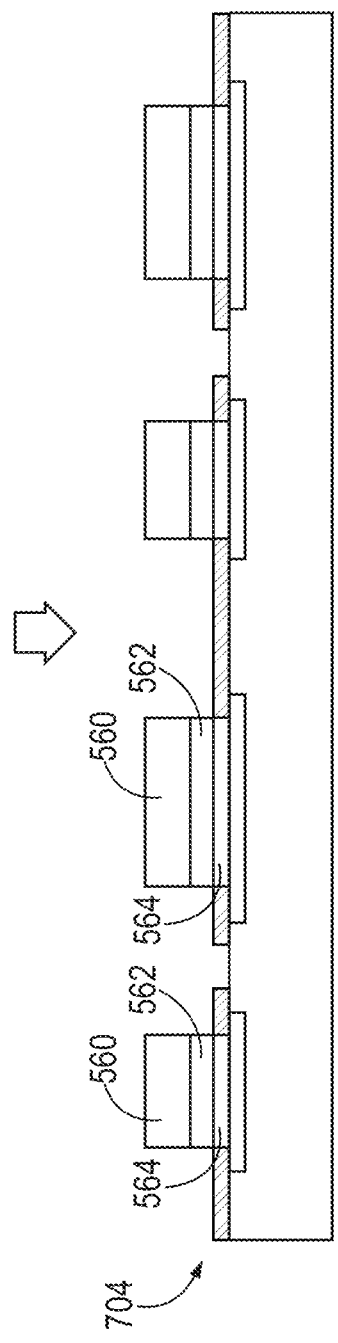
Figure 7C:
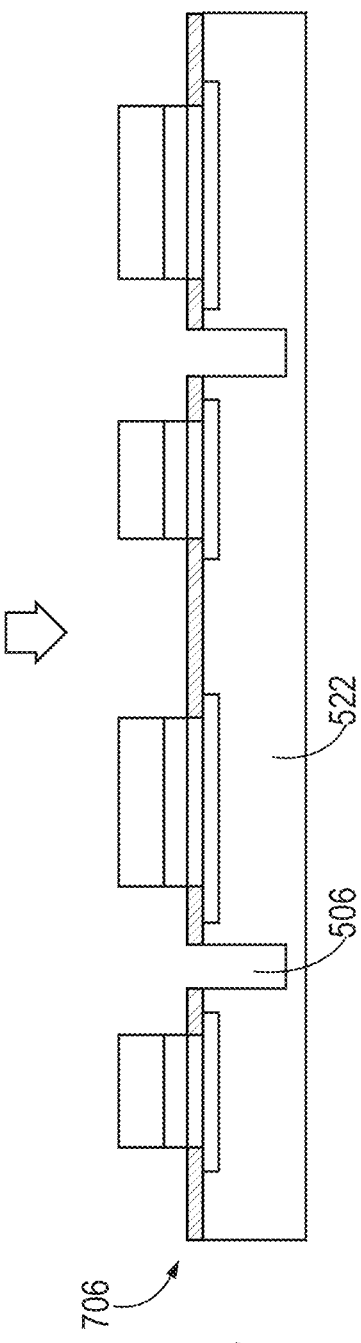

As shown in FIG. 7A, operation 702 includes providing a wafer substrate assembly having the wafer substrate 522, the dielectric material 570, the electrical terminals (e.g., 512, 516-2), and the metal-based layer 564. As shown in FIG. 7B, operation 704 includes depositing the metal-based layer 562 on the metal-based layer 564 and depositing the metal-based layer 560 on the metal-based layer 562, thereby forming each electrode. As shown in FIG. 7C, operation 706 includes etching the wafer substrate to create the isolation area 506. As shown in FIG. 7D, operation 708 includes applying the molding material 526 to the semiconductor device 500. As shown in FIG. 7E, operation 710 includes grinding the molding material 526. As shown in FIG. 7F, operation 712 includes etching (e.g., dry etching) the wafer substrate 522. As shown in FIG. 7G, operation 714 includes performing a sputter UBM operation to form the metal-based layer 566 on the back side of the wafer substrate 522. As shown in FIG. 7H, operation 716 includes a copper photo operation to form copper photoresist portions 594 on the metal-based layer 566. As shown in FIG. 7I, operation 718 includes a nickel plating operation to form the metal-based layer 568 on the metal-based layer 566. As shown in FIG. 7J, operation 720 includes a photoresist removal operation to remove the copper photoresist portion 594 and a UBM etch/laser mark operation to remove portions of the metal-based layer 566. As shown in FIG. 7K, operation 722 includes tap mounting operation to mount a tape 596 to the back side of the semiconductor device 500 and a ring cut operation to remove a ring portion 598 of the semiconductor device 500. As shown in FIG. 7L, operation 724 includes picking up the semiconductor device 500.

Figure 8:
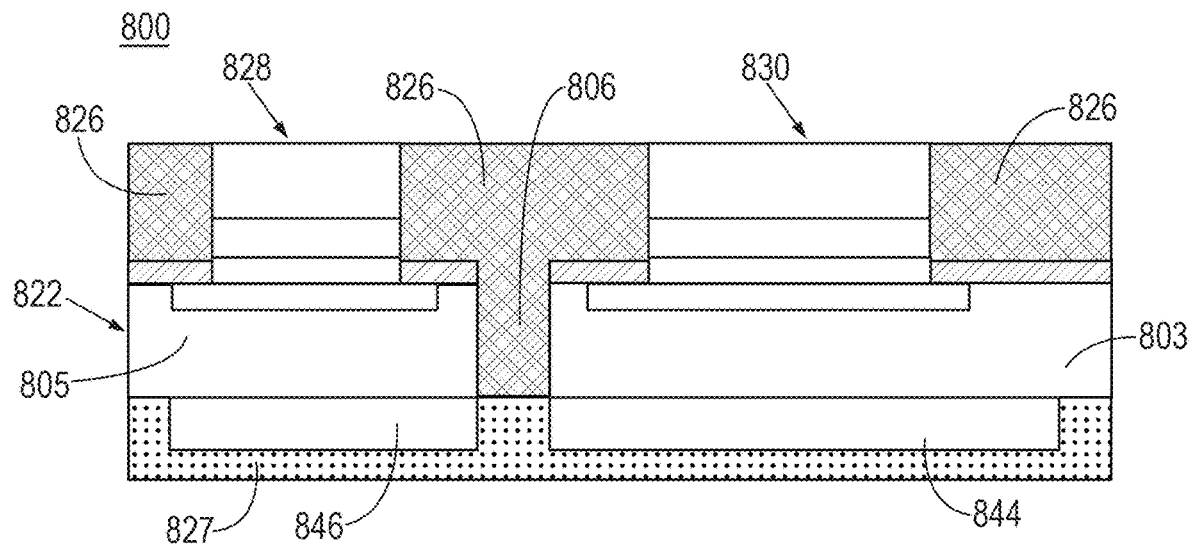
FIG. 8 illustrates a semiconductor device that uses a molding material for an isolation area and a solder resist material for back-side encapsulation according to an aspect.

FIG. 8 illustrates a semiconductor device 800 according to another aspect. The semiconductor device 800 may include any of the details discussed with reference to the previous figures. The semiconductor device 800 includes a wafer substrate 822 defining a first region 803 and a second region 805, a backplate portion 844 coupled to the back side of the first region 803, a backplate plate portion 846 coupled to the back side of the second region 805, an electrode 830 coupled to the top side of the first region 803, and an electrode 828 coupled to the top side of the second region 805. The semiconductor device 800 defines an isolation area 806 between the first region 803 and the second region 805. As shown in FIG. 8, a molding material 826 is applied to isolation area 806 and to the top side of the wafer substrate 822, and a solder resist material 827 is applied to the back side of the wafer substrate 822.

Figure 9:
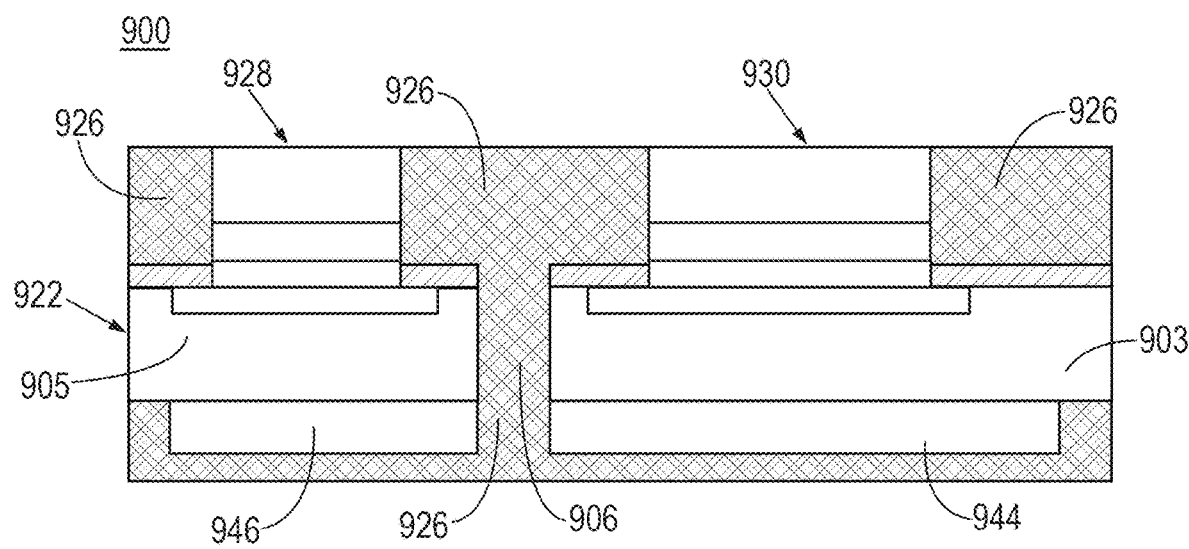
FIG. 9 illustrates a semiconductor device that uses a molding material for an isolation area and a molding material for back-side encapsulation according to an aspect.

FIG. 9 illustrates a semiconductor device 900 according to another aspect. The semiconductor device 900 may include any of the details discussed with reference to the previous figures. The semiconductor device 900 includes a wafer substrate 922 defining a first region 903 and a second region 905, a backplate portion 944 coupled to the back side of the first region 903, a backplate plate portion 946 coupled to the back side of the second region 905, an electrode 930 coupled to the top side of the first region 903, and an electrode 928 coupled to the top side of the second region 905. The semiconductor device 900 defines an isolation area 906 between the first region 903 and the second region 905. As shown in FIG. 9, a molding material 926 is applied to isolation area 906, to the top side of the wafer substrate 922, and to the back side of the wafer substrate 922.

Figure 10A:
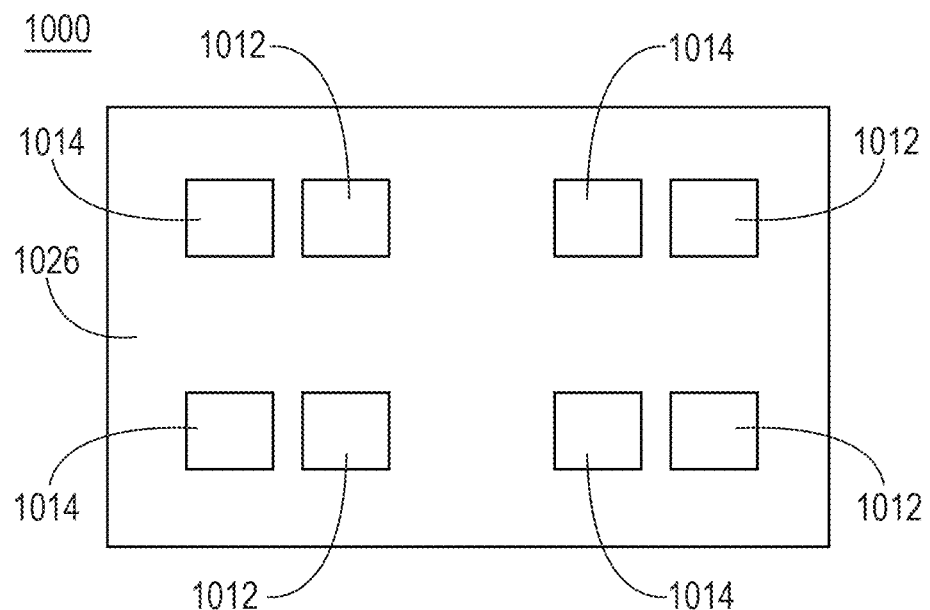
FIG. 10A illustrates a top view perspective of a semiconductor device that integrates four devices on a chip according to an aspect.
Figure 10B:
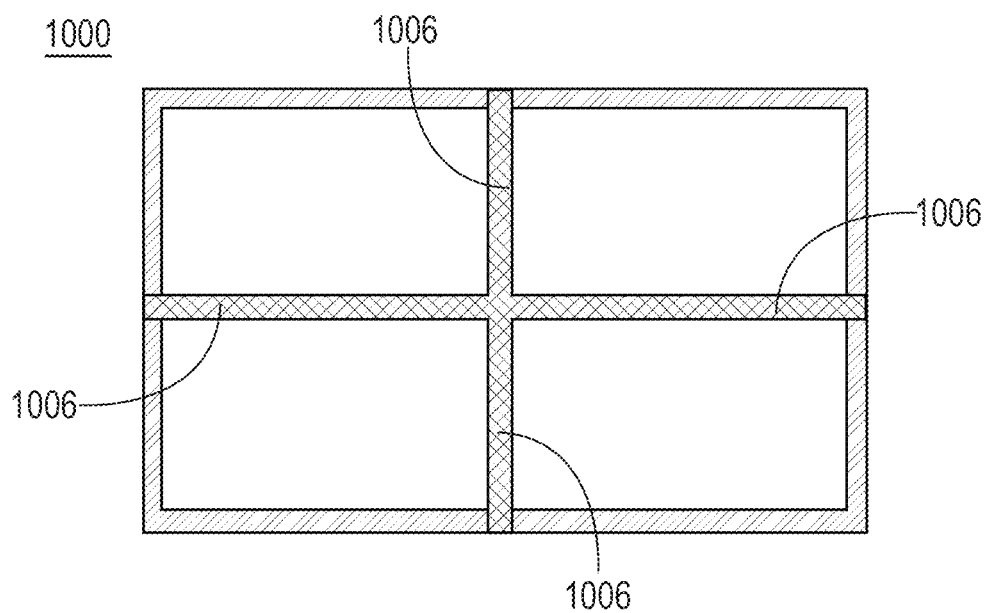
FIG. 10B illustrates a bottom view perspective of a semiconductor device that integrates four devices on a chip according to an aspect.

FIGS. 10A and 10B illustrate a semiconductor device 1000 according to an aspect. The semiconductor device 1000 may integrate four transistors in a single chip. FIG. 10A illustrates a top view perspective of the semiconductor device 1000. FIG. 10B illustrates a bottom view perspective of the semiconductor device 1000. As shown in FIGS. 10A and 10B, four transistors are formed, where each transistor is formed in a separate corner portion of the device. For example, each transistor includes a source contact 1012 and a gate contact 1014 that are exposed through a molding material 1026 on the top side of the semiconductor device 1000. Also, an isolation area 1006 is defined such that each transistor is isolated from each other, where the isolation area 1006 includes the molding material 1026.

FIGS. 11A through 11K depict example fabrication operations for manufacturing a semiconductor device having isolated transistors(s). Although the fabrication operations of FIGS. 11A through 11K are discussed with reference to the semiconductor device 600 of FIGS. 6A through 6C, the fabrication operations of FIGS. 11A through 11K may be applicable to any of the semiconductor devices. Although the flowchart of FIGS. 11A through 11K illustrate operations in sequential order, it will be appreciated that this is merely an example, and that additional or alternative operations may be included. Further, operations of FIGS. 11A through 11K and related operations may be executed in a different order than that shown, or in a parallel or overlapping fashion.

As shown in FIG. 11A, operation 1102 includes providing a wafer substrate assembly having the wafer substrate 622, the dielectric material 670, the electrical terminals (e.g., 612, 616-2), and the metal-based layer 664. As shown in FIG. 11B, operation 1104 includes depositing the metal-based layer 662 on the metal-based layer 664, thereby forming each electrode and the metal pad 680. As shown in FIG. 11C, operation 1106 includes mounting a tape 696 and etching the wafer substrate 622. As shown in FIG. 11D, operation 1108 includes removing a portion of the wafer substrate 622 to create the isolation area 806 (e.g., via), where the portion of the wafer substrate 622 may be removed by silicon etching. As shown in FIG. 11E, operation 1110 includes filling the via (e.g., the isolation area 606) with a solder resist material 626. As shown in FIG. 11F, operation 1112 includes performing a sputter UBM operation to form the metal-based layer 666 on the back side of the wafer substrate 622. As shown in FIG. 11G, operation 1114 includes a copper photo operation to form copper photoresist portions 694 on the metal-based layer 666. As shown in FIG. 11H, operation 1116 includes a nickel plating operation to form the metal-based layer 668 on the metal-based layer 666. As shown in FIG. 11I, operation 1118 includes a photoresist removal operation to remove the copper photoresist portion 694, a UBM etch/laser mark operation to remove portions of the metal-based layer 666, and a tape removal operation to remove the tape 696. As shown in FIG. 11J, operation 1120 includes tap mounting operation to mount a tape 697 to the back side of the semiconductor device 500 and a ring cut operation to remove a ring portion 698 of the semiconductor device 600. As shown in FIG. 11L, operation 1122 includes picking up the semiconductor device 600.

Figure 12:
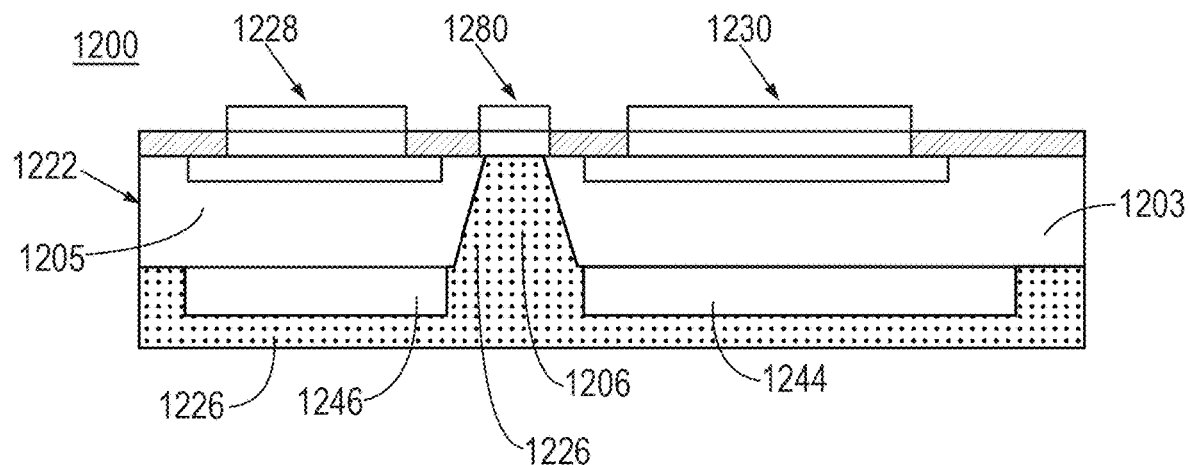
FIG. 12 illustrates a semiconductor device that uses a solder resist material for an isolation area and a solder resist material for back-side encapsulation according to an aspect.

FIG. 12 illustrates a semiconductor device 1200 according to another aspect. The semiconductor device 1200 may include any of the details discussed with reference to the previous figures. The semiconductor device 1200 includes a wafer substrate 1222 defining a first region 1203 and a second region 1205, a backplate portion 1244 coupled to the back side of the first region 1203, a backplate plate portion 1246 coupled to the back side of the second region 1205, an electrode 1230 coupled to the top side of the first region 1203, and an electrode 1228 coupled to the top side of the second region 1205. The semiconductor device 1200 includes a metal pad 1280 coupled to the isolation area 1206 on the top side of the wafer substrate 1222. The semiconductor device 1200 defines an isolation area 1206 between the first region 1203 and the second region 1205. As shown in FIG. 12, a solder resist material 1226 is applied to the isolation area 1206 and to the back side of the wafer substrate 1222.

Figure 13:
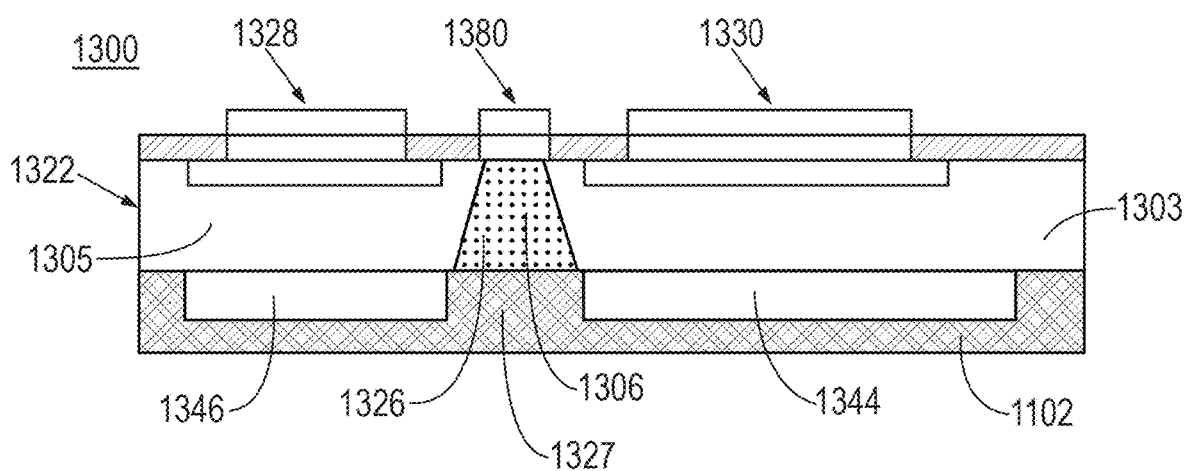
FIG. 13 illustrates a semiconductor device that uses a solder resist material for an isolation area and a molding material for back-side encapsulation according to an aspect.

FIG. 13 illustrates a semiconductor device 1300 according to another aspect. The semiconductor device 1300 may include any of the details discussed with reference to the previous figures. The semiconductor device 1300 includes a wafer substrate 1322 defining a first region 1303 and a second region 1305, a backplate portion 1344 coupled to the back side of the first region 1303, a backplate plate portion 1346 coupled to the back side of the second region 1305, an electrode 1330 coupled to the top side of the first region 1303, and an electrode 1328 coupled to the top side of the second region 1305. The semiconductor device 1300 includes a metal pad 1380 coupled to the isolation area 1306 on the top side of the wafer substrate 1322. The semiconductor device 1300 defines an isolation area 1306 between the first region 1303 and the second region 1305. As shown in FIG. 13, a solder resist material 1326 is applied to the isolation area 1306, and a molding material 1327 is applied to the back side of the wafer substrate 1322.

Figure 14:
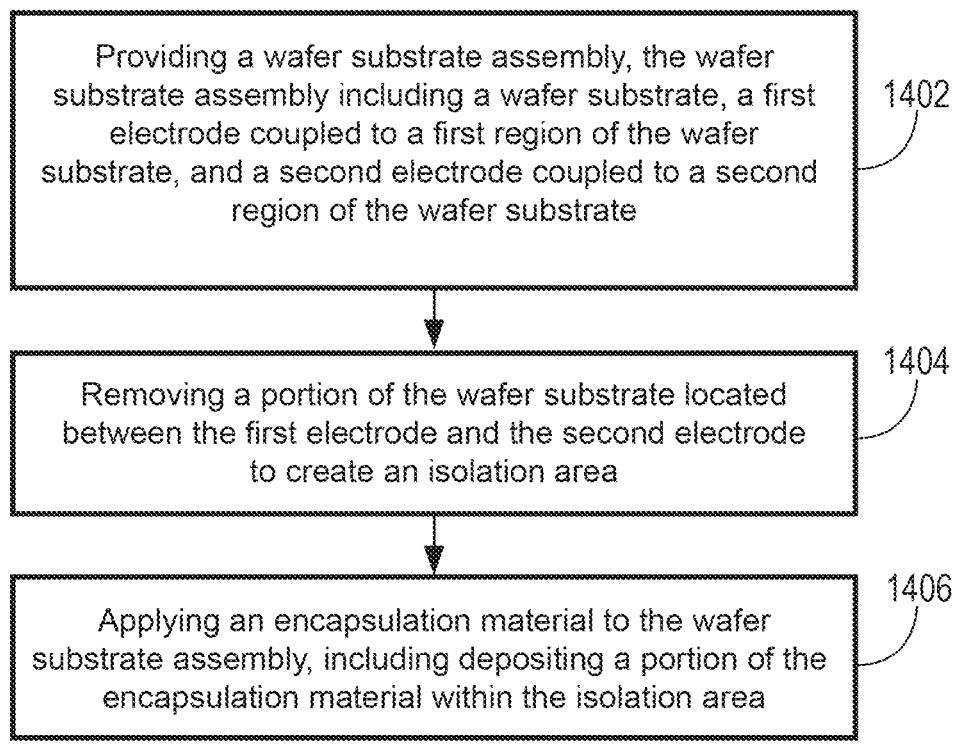
FIG. 14 illustrates a flowchart for fabricating a semiconductor device according to an aspect.

FIG. 14 depicts a flowchart 1400 depicting example fabrication operations for manufacturing a wafer substrate assembly according to an aspect. The flowchart may be applicable to any of the semiconductor devices discussed herein. Although the flowchart 1400 of FIG. 14 illustrates operations in sequential order, it will be appreciated that this is merely an example, and that additional or alternative operations may be included. Further, operations of FIG. 14 and related operations may be executed in a different order than that shown, or in a parallel or overlapping fashion.

Operation 1402 includes providing a wafer substrate assembly, where the wafer substrate assembly includes a wafer substrate, a first electrode coupled to a first region of the wafer substrate, and a second electrode coupled to a second region of the wafer substrate.

Operation 1404 includes removing a portion of the wafer substrate located between the first electrode and the second electrode to create an isolation area.

Operation 1406 includes applying an encapsulation material to the wafer substrate assembly, including depositing a portion of the encapsulation material within the isolation area.

It will be understood that, in the foregoing description, when an element is referred to as being connected to, electrically connected to, coupled to, or electrically coupled to another element, it may be directly connected or coupled to the other element, or one or more intervening elements may be present. In contrast, when an element is referred to as being directly connected to or directly coupled to another element, there are no intervening elements. Although the terms directly connected to, or directly coupled to may not be used throughout the detailed description, elements that are shown as being directly connected or directly coupled can be referred to as such. The claims of the application, if any, may be amended to recite exemplary relationships described in the specification or shown in the figures. Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques.

Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. A semiconductor device for integrating multiple transistors, the semiconductor device comprising:
    a wafer substrate including a first region and a second region, the first region defining at least a portion of at least one first transistor, the second region defining at least a portion of at least one second transistor;
    an isolation area located between the first region and the second region;
    at least one terminal of the at least one first transistor contacting the first region of the wafer substrate;
    at least one terminal of the at least one second transistor contacting the second region of the wafer substrate;
    an electrode coupled to the at least one terminal of the at least one first transistor; and
    an encapsulation material, the encapsulation material including a first portion located within the isolation area and a second portion extending from the first portion to at least a portion of a first edge of the electrode, the encapsulation material including a third portion that extends between a second edge of the electrode and an edge of the semiconductor device.

2. The semiconductor device of claim 1, wherein the isolation area is a first isolation area, and the wafer substrate includes a third region, the third region defining at least a portion of at least one third transistor, the semiconductor device further comprising:
    a second isolation area located between the first region and the third region,
    wherein the encapsulation material includes a fourth third portion located within the second isolation area.

3. The semiconductor device of claim 1, wherein the electrode is a first electrode, the semiconductor device further comprising:
    a second electrode coupled to the at least one terminal of the at least one second transistor.

4. The semiconductor device of claim 3, wherein the second portion includes a portion that extends between the first edge of the first electrode and an edge of the second electrode.

5. The semiconductor device of claim 1, further comprising:
    a backplate including a first region and a second region, the first region of the backplate contacting the first region of the wafer substrate, the second region of the backplate contacting the second region of the wafer substrate.

6. The semiconductor device of claim 1, wherein the encapsulation material includes a molding material.

7. The semiconductor device of claim 1, wherein the encapsulation material includes a solder resist material.

8. The semiconductor device of claim 1, wherein the at least one first transistor is a power field-effect transistor (FET), and the at least one second transistor is a sensor field effect transistor (FET).

9. A semiconductor device for integrating multiple transistors, the semiconductor device comprising:
    a wafer substrate including a first region and a second region, the first region defining at least a portion of at least one first transistor, the second region defining at least a portion of at least one second transistor;
    a backplate including a first region and a second region, the first region of the backplate contacting the first region of the wafer substrate, the second region of the backplate contacting the second region of the wafer substrate;
    an electrode coupled to a terminal of the at least one first transistor, the terminal contacting the first region of the wafer substrate;
    an isolation area located between the first region of the wafer substrate and the second region of the wafer substrate; and
    an encapsulation material, the encapsulation material including a first portion located within the isolation area and a second portion extending from the first portion to at least a portion of a first-aft edge of the electrode, the encapsulation material including a third portion that extends between a second edge of the electrode and an edge of the semiconductor device.

10. The semiconductor device of claim 9, wherein the electrode is a first electrode, the semiconductor device further comprising:
    a second electrode coupled to a terminal of the at least one second transistor, the terminal contacting the second region of the wafer substrate.

11. The semiconductor device of claim 10, wherein the second portion includes a portion that extends between the first edge of the first electrode and an edge of the second electrode.

12. The semiconductor device of claim 9, wherein the at least one first transistor includes two first transistors, and the at least one second transistor includes two second transistors, wherein drains of the two first transistors are connected in series, wherein drains of the two second transistors are connected in series.

13. The semiconductor device of claim 9, wherein the encapsulation material includes a molding material.

14. The semiconductor device of claim 9, wherein the encapsulation material includes a solder resist material.

15. The semiconductor device of claim 9, wherein the at least one first transistor is a power field-effect transistor (FET), and the at least one second transistor is a sensor FET.

16. A semiconductor device for integrating multiple transistors, the semiconductor device comprising:
    a wafer substrate including a first region and a second region, the first region defining at least a portion of at least one first transistor, the second region defining at least a portion of at least one second transistor;
    an isolation area located between the first region and the second region;
    at least one terminal of the at least one first transistor at least partially embedded in the first region of the wafer substrate;

at least one terminal of the at least one second transistor at least partially embedded in the second region of the wafer substrate;
an electrode coupled to the at least one terminal of the at least one first transistor; and
an encapsulation material, the encapsulation material including a first portion located within the isolation area and a second portion extending from the first portion to at least a portion of a first edge of the electrode, the encapsulation material including a third portion that extends between a second edge of the electrode and an edge of the semiconductor device.

* * * * *